US012596155B2

(12) United States Patent     (10) Patent No.:   US 12,596,155 B2
Imade et al.     (45) Date of Patent:   *Apr. 7, 2026

(54) DEVICE AND METHOD FOR DETERMINING STATE OF BATTERY PACK

(71) Applicant: TOYOTA JIDOSHA KABUSHIKI KAISHA, Toyota (JP)

(72) Inventors: Yuki Imade, Okazaki (JP); Tsubasa Migita, Chiryu (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 406 days.

This patent is subject to a terminal disclaimer.

(21) Appl. No.: 18/314,246

(22) Filed: May 9, 2023

(65) Prior Publication Data

US 2023/0273268 A1     Aug. 31, 2023

Related U.S. Application Data

(62) Division of application No. 17/228,782, filed on Apr. 13, 2021, now Pat. No. 11,686,779.

(30) Foreign Application Priority Data

Apr. 21, 2020    (JP) ................................. 2020-075256

(51) Int. Cl.
   *G01R 31/396*     (2019.01)
   *G01R 31/392*     (2019.01)
   *H02J 7/80*       (2026.01)
(52) U.S. Cl.
   CPC ......... *G01R 31/396* (2019.01); *G01R 31/392* (2019.01); *H02J 7/80* (2026.01)

(58) Field of Classification Search
None
See application file for complete search history.

(56) References Cited

U.S. PATENT DOCUMENTS

| 2016/0207415 A1* | 7/2016 | Sato ......................... B60L 58/12 |
| 2017/0030976 A1* | 2/2017 | Suzuki ................. G01R 31/389 |
| 2019/0081369 A1* | 3/2019 | Monden ................ H01M 10/48 |
| 2019/0181663 A1* | 6/2019 | Nishikawa ............ H02J 7/0048 |

(Continued)

FOREIGN PATENT DOCUMENTS

| JP | 2009216448 A | 9/2009 |
| JP | 2010019791 A | 1/2010 |

(Continued)

OTHER PUBLICATIONS

Thomann et al., "An efficient monitoring concept with control charts for on-line sensors", Water Science & Technology, 2002.

(Continued)

*Primary Examiner* — Shelby A Turner
(74) *Attorney, Agent, or Firm* — Dickinson Wright, PLLC

(57) ABSTRACT

A parameter ratio that is a ratio of a parameter of a parallel-cell block to be determined to an average value of parameters of a plurality of parallel-cell blocks is calculated, a moving-average value of the parameter ratio is obtained, and a state of the parallel-cell block to be determined is determined based on an index value that is a difference between the parameter of the parallel-cell block to be determined and the moving-average value.

7 Claims, 10 Drawing Sheets

(56) References Cited

U.S. PATENT DOCUMENTS

| | | | |
|---|---|---|---|
| 2020/0110134 A1 | 4/2020 | Li | |
| 2022/0146586 A1* | 5/2022 | Kang | .................... H02J 7/0019 |

FOREIGN PATENT DOCUMENTS

| | | | |
|---|---|---|---|
| JP | 2012037337 A | 2/2012 | |
| JP | 2013195129 A | 9/2013 | |

OTHER PUBLICATIONS

Yuki Imade et al., U.S. Appl. No. 17/228,782, filed Apr. 13, 2021.
Yuki Imade et al., U.S. Appl. No. 17/228,782, Restriction Requirement dated May 10, 2022.
Yuki Imade et al., U.S. Appl. No. 17/228,782, Non-Final Rejection dated Sep. 29, 2022.
Yuki Imade et al., U.S. Appl. No. 17/228,782, Notice of Allowance dated Feb. 15, 2023.

* cited by examiner

START

S100
DETECT INTER-TERMINAL
VOLTAGE VB(m) & CURRENT IB

S102
OBTAIN PARALLEL-CELL BLOCK'S
1-SECOND RESISTANCE R1s(m) &
10-SECOND RESISTANCE R10s(m)

S104
Rs(m)=R10s(m)−R1s(m)

S106
CALCULATE AVERAGE
VALUES R1save(m) & Rsave(m)

S108
CALCULATE RESISTANCE
RATIOS R1sr(m) & Rsr(m)

S110
CALCULATE MOVING-AVERAGE
VALUES R1srma(m) & Rsrma(m)

S112
INDEX VALUE R1si(m)=R1sr(m)−R1srma(m)
INDEX VALUE Rsi(m)=Rsr(m)−Rsrma(m)

①

1

DEVICE AND METHOD FOR DETERMINING STATE OF BATTERY PACK

RELATED APPLICATION

This application is a division of U.S. patent application Ser. No. 17/228,782, filed Apr. 13, 2021, which claims priority to Japanese Patent Application No. 2020-075256 filed on Apr. 21, 2020, the entire contents of which are hereby incorporated by reference.

BACKGROUND

Field

The present disclosure relates to a device and method for determining a state of a battery pack.

Description of the Background Art

A device which operates using electrical power stored in a battery is difficult to obtain desired performance when the battery is degraded. Therefore, it is necessary to detect the battery's degraded state and timely replace the battery. As a technique for detecting a battery's degraded state, for example, Japanese Patent Laying-Open No. 2012-037337 discloses that a width of variation of a current input/output to/from a battery and a width of variation in voltage of the battery are used to calculate the current internal resistance value, which is in turn divided by an initial internal resistance value corresponding to the battery's current temperature to calculate the battery's degradation rate.

SUMMARY

In order to increase a battery's power storing capacity, a battery pack in which a plurality of cells are connected in parallel to configure a parallel-cell block and a plurality of such parallel-cell blocks are connected in series may be used. For such a battery pack, when a degraded state is detected from the parallel-cell block's internal resistance value (or combined resistance value), the degraded state cannot be suitably detected when the cells included in the parallel-cell block have significantly different internal resistance values.

The internal resistance value (or combined resistance value) of the parallel-cell block is a harmonic mean of the internal resistance values of the cells included in the parallel-cell block. Therefore, even if a cell has an increased internal resistance value and is thus in a degraded state, the parallel-cell block does not have an internal resistance value (or combined resistance value) increased to an extent indicating the degraded state, and the degraded state cannot be accurately detected from the internal resistance value (or combined resistance value) of the parallel-cell block.

An object of the present disclosure is to provide a device and method for determining a state of a battery pack comprising a plurality of parallel-cell blocks connected in series, that can accurately determine a state of the parallel-cell blocks.

The presently disclosed device that determines a state of a battery pack is a device that determines a state of a battery pack comprising three or more series-connected, parallel-cell blocks each including a plurality of cells connected in parallel. The state determination device comprises: a parameter acquisition unit that obtains a parameter (P) indicating a state of a parallel-cell block; a parameter ratio calculation unit that calculates a parameter ratio (Pr) that is a ratio of the parameter (P) of a parallel-cell block to be determined to an average value (Pave) of the parameters (P) of a plurality of parallel-cell blocks; a moving-average calculation unit that calculates a moving-average value (Prma) of the parameter ratio (Pr); an index value calculation unit that obtains an index value (Pi) that is a difference between the parameter ratio (Pr) of the parallel-cell block to be determined and the moving-average value (Prma); and a state determination unit that determines a state of the parallel-cell block to be determined, based on the index value (Pi).

According to this configuration, the battery pack comprises three or more series-connected, parallel-cell blocks each including a plurality of cells connected in parallel. The parameter ratio calculation unit calculates a parameter ratio (Pr) that is a ratio of the parameter (P) of the parallel-cell block to be determined to the average value (Pave) of the parameters (P) of a plurality of parallel-cell blocks. Since the parameter ratio (Pr) is a ratio of the parameter (P) of the parallel-cell block to be determined to the average value (Pave) of the parameters (P) of a plurality of parallel-cell blocks, it is impervious to an effect that disturbance has on the parameter (P).

The state determination unit determines a state of the parallel-cell block to be determined, based on an index value (Pi). The index value (Pi) is a difference between the parameter ratio (Pr) of the parallel-cell block to be determined and a moving-average value (Prma). The moving-average value (Prma) is an average value of time series data of the parameter ratio (Pr). Even when the parameter (P) of the parallel-cell block to be determined changes and the parameter ratio (Pr) is changed accordingly, the change has little effect on the moving-average value (Prma). Therefore, even when the parameter (P) of the parallel-cell block to be determined changes in a small amount, the index value (Pi) that is a difference between the parameter ratio (Pr) of the parallel-cell block to be determined and the moving-average value (Prma) will be a significant value. Therefore, the index value (Pi) can be used to accurately determine a state of the parallel-cell block.

The parameter ratio calculation unit may be configured to calculate a parameter ratio (Pr) that is a ratio of the parameter (P) of the parallel-cell block to be determined to an average value (Pave) of parameters (P) of a plurality of parallel-cell blocks excluding the parallel-cell block to be determined.

According to this configuration, the parallel-cell block to be determined is not involved in calculating the average value (Pave), and accordingly, an amount of change of the parameter ratio (Pr) relative to an amount of change of the parameter (P) of the parallel-cell block to be determined can be increased, and the index value (Pi) can be used to more accurately determine a state of the parallel-cell block.

The parameter acquisition unit is configured to obtain the parameter (P) whenever a predetermined time arrives, and the index value calculation unit may be configured to calculate an index value (Pi) based on a moving-average value (Prma) calculated using a parameter (P) obtained when the predetermined time immediately previously arrives, and a parameter (P) obtained when the predetermined time currently arrives.

According to this configuration, an index value (Pi) is calculated based on a moving-average value (Prma) calculated using a parameter (P) obtained when the predetermined time immediately previously arrives and a parameter (P) obtained when the predetermined time currently arrives. Therefore, the moving-average value (Prma) does not include the parameter (P) obtained when the predetermined time currently arrives, and even when the parameter (P) of the parallel-cell block to be determined changes in a small amount, the index value (Pi) that is the difference between the parameter ratio (Pr) of the parallel-cell block to be determined and the moving-average value (Prma) will be a more significant value.

As the plurality of parallel-cell blocks subject to calculation of the average value (Pave), parallel-cell blocks close in temperature to the parallel-cell block to be determined may be selected. In this case, the parameter acquisition unit is configured to obtain the parameter (P) whenever a predetermined time arrives, and a parallel-cell block close in temperature when the predetermined time arrives may be selected.

According to this configuration, even when the parameter (P) of the parallel-cell block to be determined is affected by temperature and changed, the parameters (p) of other parallel-cell blocks close in temperature to the parallel-cell block to be determined are also similarly changed, and an effect of the parameter (P) by an effect of temperature can be eliminated.

The battery pack is a battery pack mounted in a vehicle, and the predetermined time may be any one of: when the battery pack is externally charged; when an amount of power stored in the battery pack reaches a predetermined value while the vehicle is traveling; when the vehicle starts traveling; and when the vehicle ends traveling.

According to this configuration, a state of the battery pack mounted in the vehicle can be determined while an effect of the temperature of the battery pack is eliminated.

The parameter (P) may be at least one of an internal resistance of the parallel-cell block, an amount of self-discharge by the parallel-cell block, or a cell capacity of the parallel-cell block.

According to this configuration, a parallel-cell block's internal resistance, amount of self-discharge, or cell capacity can be used to determine a degraded state of the battery pack satisfactorily.

The state determination unit may be configured to determine a degraded state of the parallel-cell block to be determined, based on the index value (Pi), and determine the degraded state of the parallel-cell block, based on the parameter (P) of the parallel-cell block to be determined.

According to this configuration, a degraded state of the parallel-cell block is also determined by the parameter (P) in addition to the index value (Pi), and for example even when the parallel-cell block is in a degraded state, the parameter ratio (Pr) hardly changes, and a degraded state which cannot be determined by the index value (Pi) can be determined.

The state determination unit may be configured to output at least one of warning information and identification information of the parallel-cell block to be determined when it is determined that the index value (Pi) deviates from a predetermined range. According to this configuration, when it is determined that the index value (Pi) deviates from a predetermined range, warning information or identification information of the parallel-cell block to be determined is output, and for example a user can be alerted and a degraded parallel-cell block can be identified.

The presently disclosed method for determining a state of a battery pack is a method for determining a state of a battery pack comprising three or more series-connected, parallel-cell blocks each including a plurality of cells connected in parallel, the method comprising: obtaining a parameter (P) indicating a state of a parallel-cell block; calculating a parameter ratio (Pr) that is a ratio of a parameter (P) of a parallel-cell block to be determined to an average value (Pave) of parameters (P) of a plurality of parallel-cell blocks; calculating a moving-average value (Prma) of the parameter ratio (Pr); obtaining an index value (Pi) that is a difference between the parameter (P) of the parallel-cell block to be determined and the moving-average value (Prma); and determining a state of the parallel-cell block to be determined, based on the index value (Pi).

According to this configuration, a parameter ratio (Pr) that is a ratio of the parameter (P) of the parallel-cell block to be determined to the average value (Pave) of the parameters (P) of a plurality of parallel-cell blocks is calculated. Since the parameter ratio (Pr) is a ratio of the parameter (P) of the parallel-cell block to be determined to the average value (Pave) of the parameters (P) of the plurality of parallel-cell blocks, it is impervious to an effect that disturbance has on the parameter (P). An index value (Pi) that is a difference between the parameter ratio (Pr) of the parallel-cell block to be determined and a moving-average value (Prma) is calculated. The moving-average value (Prma) is an average value of time series data of the parameter ratio (Pr). Even when the parameter (P) of the parallel-cell block to be determined changes and the parameter ratio (Pr) accordingly changes, the change has little effect on the moving-average value (Prma). Therefore, even when the parameter (P) of the parallel-cell block to be determined changes in a small amount, the index value (Pi) that is a difference between the parameter ratio (Pr) of the parallel-cell block to be determined and the moving-average value (Prma) will be a significant value. Therefore, the index value (Pi) can be used to accurately determine a state of the parallel-cell block.

The step of calculating a parameter ratio (Pr) may be the step of calculating a parameter ratio (Pr) that is a ratio of the parameter (P) of the parallel-cell block to be determined to an average value (Pave) of parameters (P) of a plurality of parallel-cell blocks excluding the parallel-cell block to be determined.

According to this configuration, the parallel-cell block to be determined is not involved in calculating the average value (Pave), and accordingly, an amount of change of the parameter ratio (Pr) relative to an amount of change of the parameter (P) of the parallel-cell block to be determined can be increased, and the index value (Pi) can be used to more accurately determine a state of the parallel-cell block.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

The present disclosure will now be described in embodiments hereinafter in detail with reference to the drawings. In the figures, identical or corresponding components are identically denoted and will not be described repeatedly.

Figure 1:
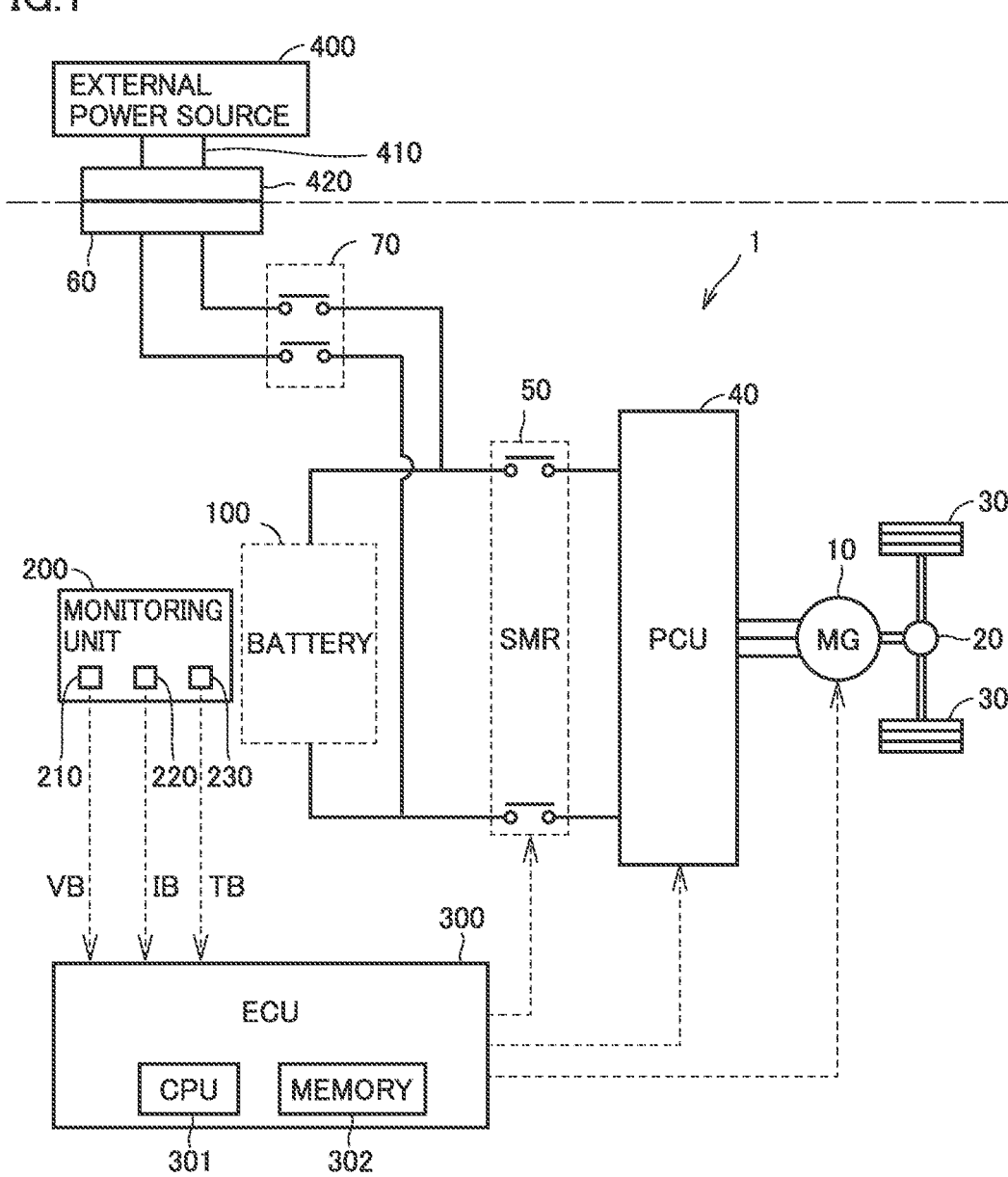
FIG. 1 is a diagram generally showing a configuration of an electric powered vehicle 1 comprising a device that determines a state of a battery pack according to an embodiment.

FIG. 1 is a diagram generally showing a configuration of an electric powered vehicle 1 comprising a device that determines a state of a battery pack according to an embodiment.

In the present embodiment, electric powered vehicle 1 is for example an electric vehicle. Electric powered vehicle 1 includes a motor generator (MG) 10 that is a rotating electrical machine, a power transmission gear 20, a driving wheel 30, a power control unit (PCU) 40, a system main relay (SMR) 50, a battery 100, a monitoring unit 200, and an electronic control unit (ECU) 300 that is an example of the state determination device.

MG 10 is for example an interior permanent magnet synchronous motor (IPM motor), and has a function as an electric motor (a motor) and a function as a power generator (a generator). MG 10 outputs torque which is in turn transmitted to driving wheel 30 via power transmission gear 20 including a reduction gear, a differential device, and the like.

When electric powered vehicle 1 is braked, driving wheel 30 drives MG 10, and MG 10 operates as a generator. Thus, MG 10 also functions as a braking device that performs regenerative braking to convert kinetic energy of electric powered vehicle 1 into electrical power. Electrical power regenerated in MG 10 by regenerative braking force is stored to battery 100.

PCU 40 is a power conversion device to bi-directionally convert electrical power between MG 10 and battery 100. PCU 40 includes, for example, an inverter and a converter that operate in response to a control signal issued from ECU 300.

When battery 100 is discharged, the converter increases voltage received from battery 100 and supplies the increased voltage to the inverter. The inverter receives DC power from the converter and converts it to AC power to drive MG 10.

In contrast, when battery 100 is charged, the inverter receives AC power generated by MG 10, converts the AC power to DC power, and supplies the DC power to the converter. The converter receives voltage from the inverter, decreases the received voltage to a voltage suitable for charging battery 100, and supplies the decreased voltage to battery 100.

PCU 40 operates in response to a control signal received from ECU 300 to stop the inverter and the converter from operating and thus stop charging/discharging. PCU may have a configuration without the converter.

SMR 50 is electrically connected to an electrical power line connecting battery and PCU 40 together. When SMR 50 is closed (or turned ON) in response to a control signal received from ECU 300 (that is, when SMR 50 conducts), battery 100 and PCU 40 can communicate electrical power with each other. On the other hand, when SMR 50 is opened (or turned OFF) in response to a control signal received from ECU 300 (that is, when SMR 50 is disconnected), battery 100 and PCU 40 are electrically disconnected from each other.

Battery 100 stores electrical power for driving MG 10. Battery 100 is a rechargeable DC power source and is configured, for example, by a plurality of series-connected parallel-cell blocks each including a plurality of cells connected in parallel. Battery 100 corresponds to the presently disclosed battery pack. The cell includes, for example, a secondary cell such as a lithium ion secondary cell. Battery 100 will more specifically be described in configuration hereinafter.

Electric powered vehicle 1 includes an inlet 60, and battery 100 can be charged from an external power source. Inlet 60 is configured to be connectable to a connector provided at an end of a charging cable 410 of an external power source (or charging facility) 400. A charging relay 70 is electrically connected to an electrical power line connecting inlet 60 and battery 100. Charging relay 70 switches between supplying and interrupting electrical power between inlet 60 and battery 100 in response to a control signal received from ECU 300. When charging relay 70 is closed, battery 100 is externally charged.

Monitoring unit 200 includes a voltage detection unit 210, a current sensor 220, and a temperature detection unit 230. Voltage detection unit 210 detects a voltage VB between terminals of each of the plurality of parallel-cell blocks. Current sensor 220 detects a current IB input to and output from battery 100. Temperature detection unit detects a temperature TB of each of the plurality of cells. Each detection unit outputs its detection result to ECU 300.

ECU 300 includes a CPU (Central Processing Unit) 301 and a memory (e.g., including a ROM (Read Only Memory), a RAM (Random Access Memory), and the like) 302. ECU 300 controls each device so that electric powered vehicle 1 is in a desired state, based on a signal received from monitoring unit 200, signals received from a variety of sensors (not shown) (e.g., an accelerator pedal position signal, a vehicular speed signal, and the like), a map, a program and the like stored in memory 302, and other information. Further, ECU 300 operates as a state determination device to determine a state of battery 100.

<Detailed Configuration of Battery 100>

Figure 2:
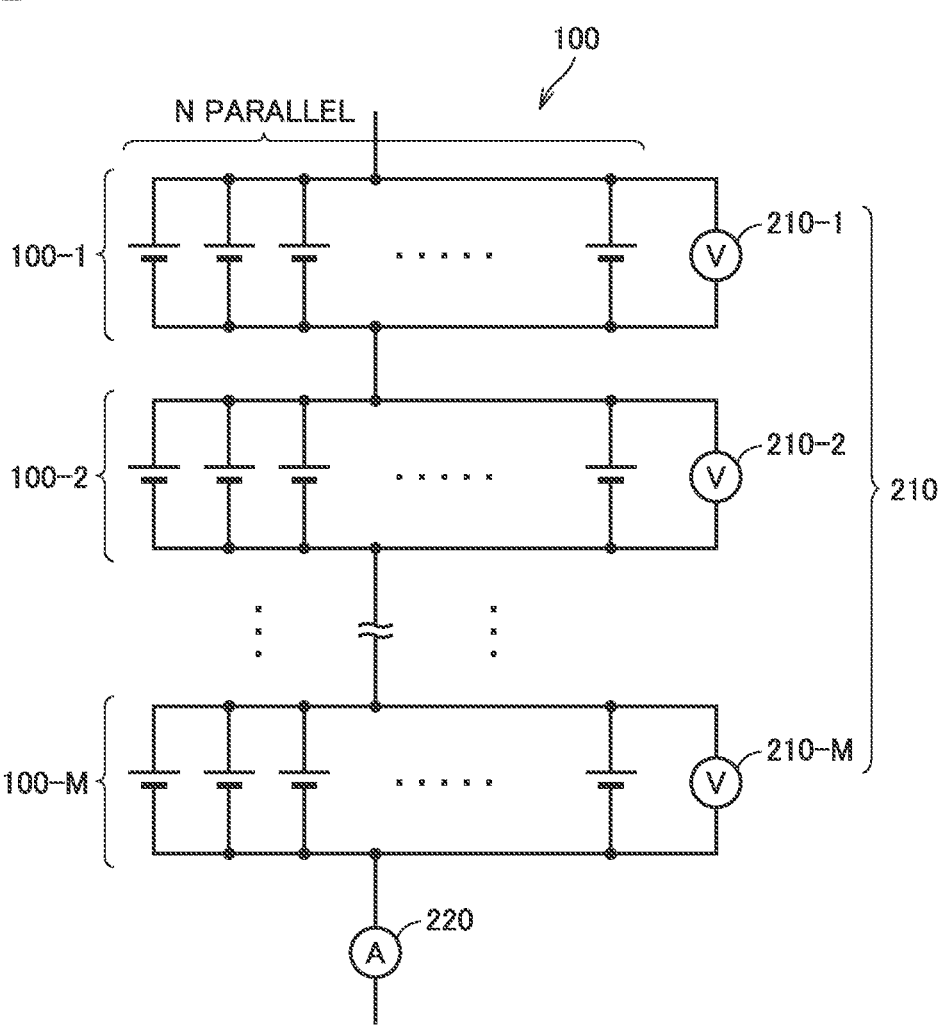
FIG. 2 is a diagram showing an example of a detailed configuration of a battery 100.

FIG. 2 is a diagram showing an example of a detailed configuration of battery shown in FIG. 1. Referring to FIG. 2, battery 100 is configured such that a plurality of cells (for example, N cells) are connected in parallel to form a parallel-cell block, and a plurality of such parallel-cell blocks (for example, M blocks) are connected in series.

Specifically, battery 100 includes parallel-cell blocks 100-1 to 100-M connected in series, and each of parallel-cell blocks 100-$m$ ($m$ being an integer of 1 to M) includes N cells connected in parallel. It is desirable that M be 3 or more.

Voltage detection unit 210 includes voltage sensors 210-1 to 210-M. Voltage sensor 210-$m$ detects an inter-terminal voltage VB(m) ($m$ being an integer of 1 to M) of each of parallel-cell blocks 100-1 to 100-M. That is, voltage sensor 210-1 detects an inter-terminal voltage VB(1) of parallel-cell block 100-1. Similarly, voltage sensors 210-2 to 210-M detect inter-terminal voltages VB(2) to VB(M) of parallel-cell blocks 100-2 to 100-M, respectively. Voltage detection unit 210 transmits the detected inter-terminal voltages VB(1) to VB(M) to ECU 300. Current sensor 220 detects current IB flowing through each of parallel-cell blocks 100-1 to 100-M.

First Embodiment

Let us consider battery 100 in which parallel-cell blocks each including two cells (a cell A and a cell B) are connected in series. When cell A has an internal resistance value r1 and cell B has an internal resistance value r2, the parallel-cell block will have an internal resistance value (or a combined resistance value) R of (r1\*r2)/(r1+r2). For example, let us assume a case in which cells A and B have an initial internal resistance value of 1.75 mΩ (or having the value when the cells are unused) and when the internal resistance value exceeds 5.6 mΩ, degradation causes excessive resistance, and accordingly, the parallel-cell block needs to be replaced.

Figures 3A, 3B:
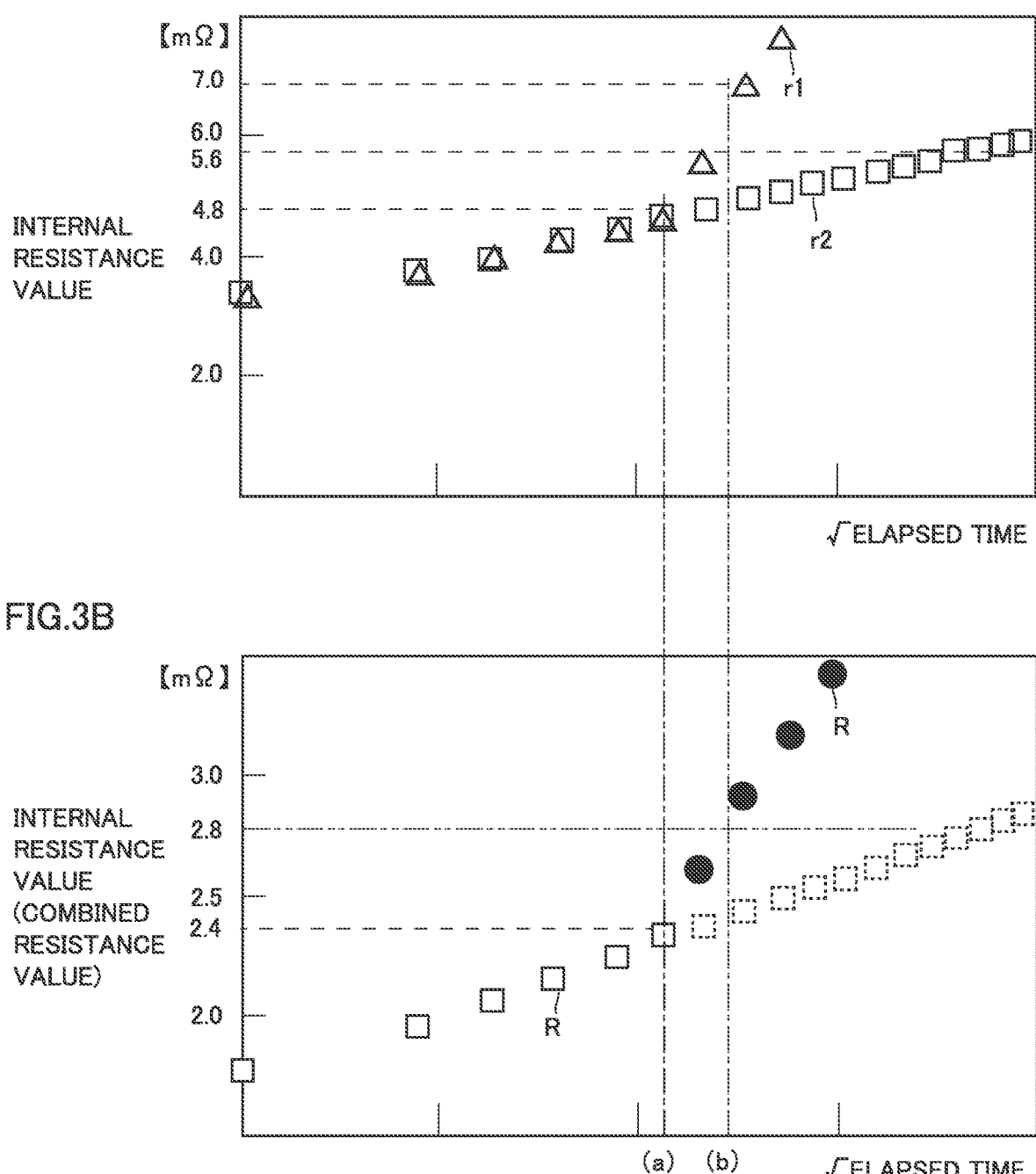
FIGS. 3A and 3B are diagrams showing how a parallel-cell block's internal resistance value transitions.

FIGS. 3A and 3B are diagrams showing how a parallel-cell block's internal resistance value transitions. The axis of ordinates represents the internal resistance value in magnitude, and the axis of abscissas represents a square root of elapsed time. FIG. 3A plots transition in internal resistance of cells A and B included in parallel-cell block 100-1, wherein a blank triangle represents internal resistance value r1 of cell A and a blank square represents internal resistance value R2 of cell B. FIG. 3B represents transition of internal resistance value (or combined resistance value) R of the parallel-cell block. As shown in FIG. 3A, cells A and B gradually degrade from their initial states, and their internal resistance values r1 and r2 gradually increase. FIG. 3A shows an example in which before a time (a) elapses, cells A and B normally degrade, and after time (a) elapses, cell A is abnormally degraded and internal resistance value r1 rapidly increases.

When cells A and B degrade as shown in FIG. 3A, then, the parallel-cell block has internal resistance value (or combined resistance value) R gradually increasing before time (a) elapses, as indicated in FIG. 3B by the blank square, and increasing after time (a) elapses, as indicated in FIG. 3B by a solid circle. In FIG. 3B, a two-dot chain line represents a threshold value of 2.8 mΩ which is a threshold value set to detect that internal resistances r1 and r2 of cells A and B both normally degrade and exceed 5.6 mΩ which requires replacement. When the parallel-cell block has internal resistance R exceeding the threshold value of 2.8 mΩ that is, at a time point (b), cell A has internal resistance value r1 of 7.0 mΩ as shown in FIG. 3A. (Cell B has internal resistance value r2 of 4.7 ma) Therefore, in FIG. 3B, when the threshold value is set to 2.8 mΩ then, until cell A abnormally degraded has internal resistance r1 significantly exceeding 5.6 mΩ that requires replacement, the degradation cannot be detected, and the parallel-cell block's abnormal degradation cannot be detected satisfactorily.

In order to detect the parallel-cell block's abnormal degradation, for example, it is assumed that a threshold value of 2.4 mΩ is set for internal resistance value R of the parallel-cell block in order to detect a state in which cell A is abnormally degraded and reaches 5.6 mΩ and cell B normally degrades and reaches 4.0 mΩ In this case, when cells A and B both normally degrade, and internal resistances r1 and r2 of cells A and B are both 4.8 ma internal resistance R of parallel-cell block 100-1 becomes 2.4 mΩ Therefore, before internal resistances r1 and r2 of cells A and B increase to 5.8 mΩ it is determined that replacement is necessary, and the cell cannot be fully utilized in performance.

In the first embodiment, in order to solve such a problem and satisfactorily detect abnormal degradation of parallel-cell block 100-_m_, a ratio of an internal resistance R(m) of parallel-cell block 100-_m_ to an average value of internal resistances R(m) of other parallel-cell blocks is used to determine a degraded state of parallel-cell block 100-_m_.

Figure 4:
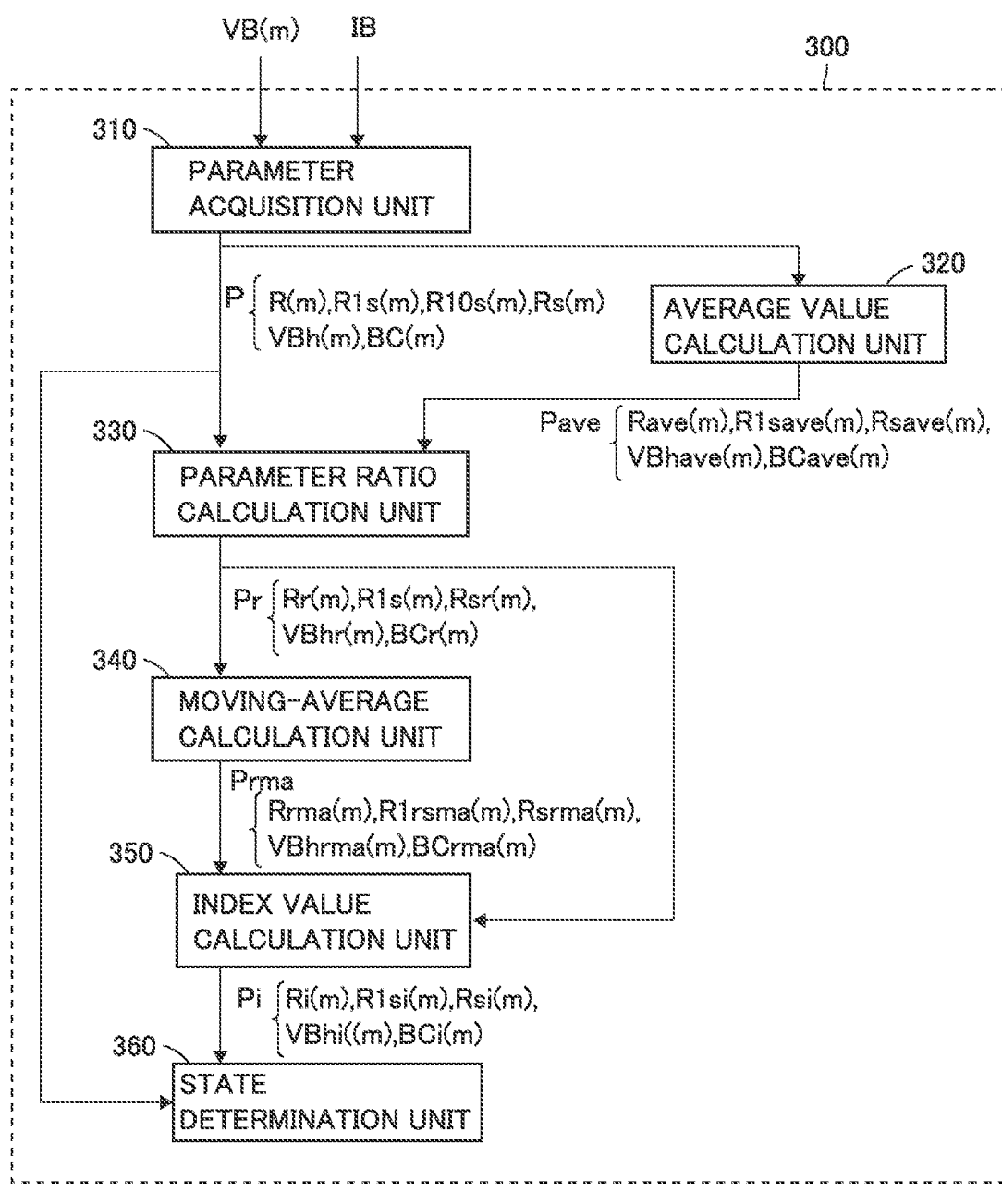
FIG. 4 is a functional block diagram according to the state determination device at ECU 300.
Figure 5:
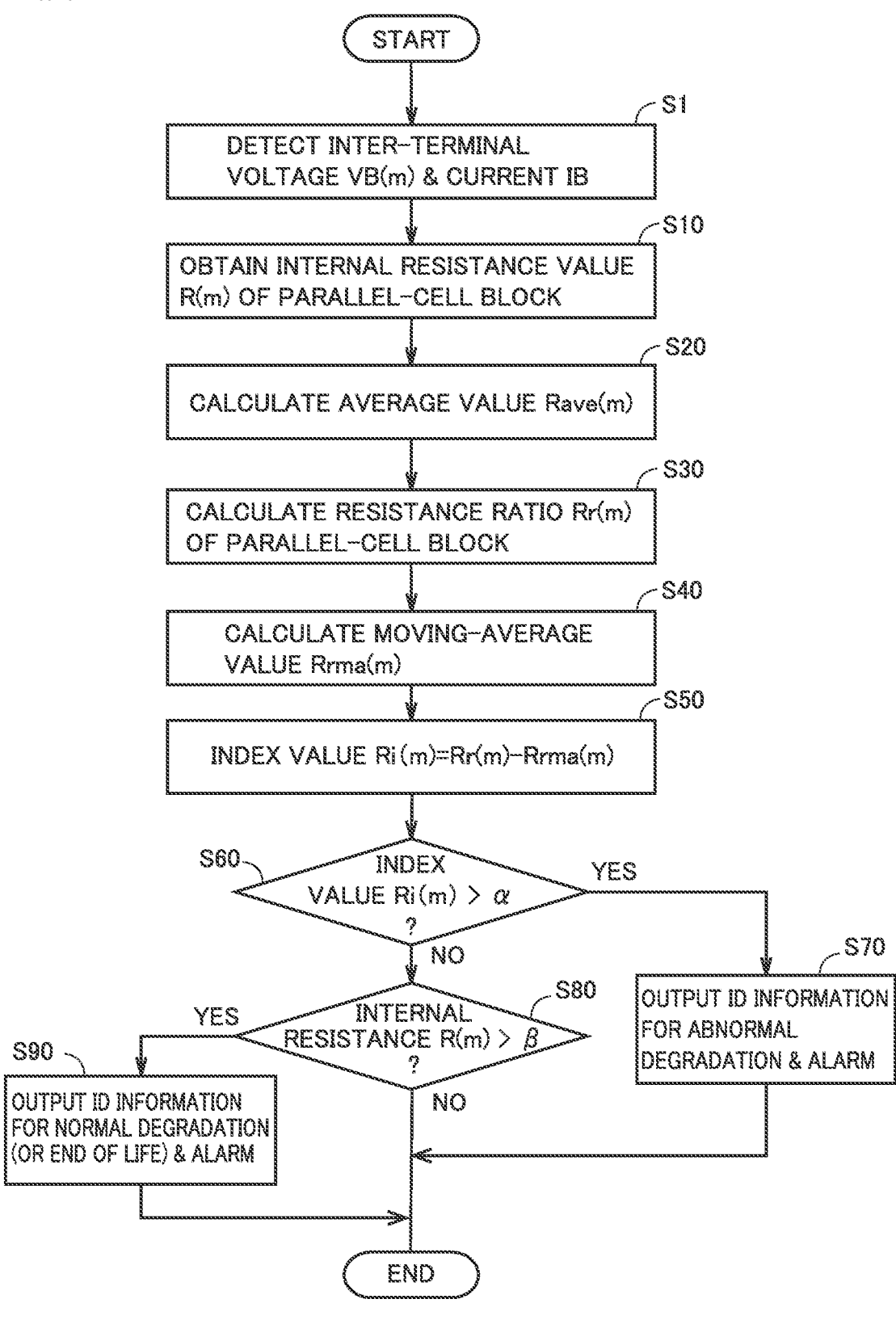
FIG. 5 is a flowchart of a procedure of a process performed by ECU 300 in a first embodiment.

FIG. 4 is a functional block diagram according to the state determination device at ECU 300. These configurations may be implemented by software processing or hardware (or electric circuitry). FIG. 5 is a flowchart of a procedure of a process performed by ECU 300. Hereinafter, a method for determining a degraded state of battery 100 according to the first embodiment will be described with reference to FIGS. 4 and 5.

The flowchart shown in FIG. 5 is performed, for example, whenever battery 100 is externally charged. Initially, in step (hereinafter, abbreviated as "S") 1, parallel-cell block 100-_m_'s inter-terminal voltage VB(m) and current IB are detected. Subsequently, in S10, parameter acquisition unit 310 calculates internal resistance value (or combined resistance value) R(m) of parallel-cell block 100-_m_ based on the detected voltage VB(m) and current IB to obtain internal resistance value R(m). For example, as is well known, internal resistance value R(m) of parallel-cell block 100-_m_ is calculated from a slope of an I-V characteristic of parallel-cell block 100-_m_. Internal resistance value R(m) may be obtained by obtaining an open circuit voltage (OCV) of parallel-cell block 100-_m_ and obtaining internal resistance value R(m) from open circuit voltage (OCV), and voltage VB(m) and current IB.

Figure 6:
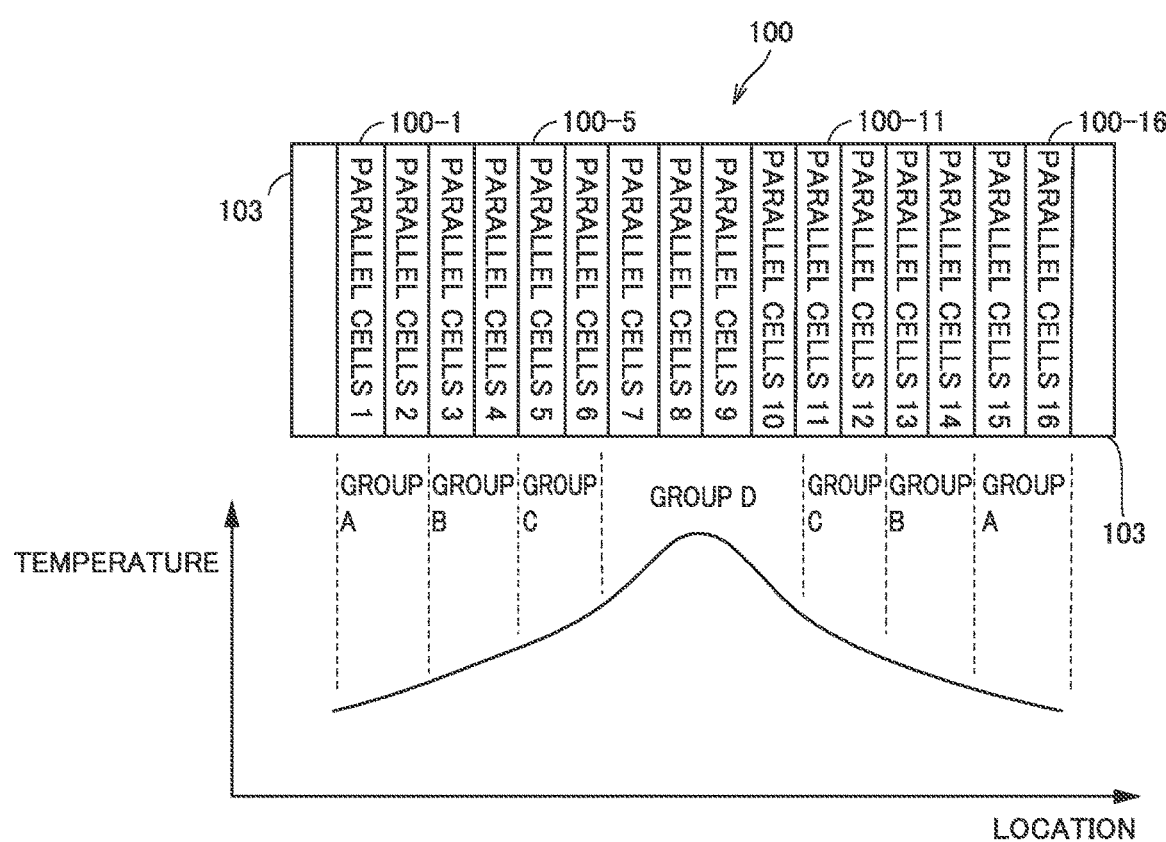
FIG. 6 is a diagram showing a configuration of battery 100 in the first embodiment.

In S20, internal resistance value R(m) of parallel-cell block 100-_m_ is used to calculate an average value Rave(m) of internal resistance values R(m) of a plurality of parallel-cell blocks 100-_m_. Average value Rave(m) is an average value of internal resistance values R(m) of a plurality of parallel-cell blocks 100-_m_ close in temperature to parallel-cell block 100-_m_ subjected to determination of a degraded state. FIG. 6 is a diagram showing a configuration of battery 100 according to the present embodiment. As shown in FIG. 6, in the present embodiment, 16 parallel-cell blocks 100-_m_ (where m=16) are connected in series and stacked between a pair of end plates 103. The pair of end plates 103 is provided with a restraining member (not shown), and parallel-cell block 100-_m_ receives a restraining load exerted by end plates 103.

When battery 100 is externally charged, it generates heat, which is radiated via the pair of end plates 103, and accordingly, parallel-cell block 100-_m_ closer to the pair of end plates 103 is lower in temperature and parallel-cell block 100-_m_ closer to the center is higher in temperature, as shown in FIG. 6. In the present embodiment, parallel-cell blocks 100-_m_ are divided into four groups A to D each composed of parallel-cell blocks 100-_m_ close in temperature to calculate average value Rave(m). Specifically, parallel-cell blocks 100-_m_ are divided into a group A composed of parallel-cell blocks 100-1 (parallel cells 1), 100-2 (parallel cells 2), 100-15 (parallel cells 15) and 100-16 (parallel cells 16), a group B composed of parallel-cell blocks 100-3 (parallel cells 3), 100-4 (parallel cells 4), 100-13 (parallel cells 13) and 100-14 (parallel cells 14), a group C composed of parallel-cell blocks 100-5 (parallel cells 5), 100-6 (parallel cells 6), 100-11 (parallel cells 11) and 100-12 (parallel cells 12), and a group D composed of parallel-cell blocks 100-7 (parallel cells 7), 100-8 (parallel cells 8), 100-9 (parallel cells 9) and 100-10 (parallel cells 10).

In S20, average value calculation unit 320 calculates an average value Rave(m) in group A. Average value Rave(m) is used in calculating a resistance ratio Rr(m) of parallel-cell block 100-_m_ calculated in parameter ratio calculation unit 330 described hereinafter. An average value Rave(1) used in calculating a resistance ratio Rr(1) of parallel-cell block 100-1 is calculated as an average value of internal resistance values R(m) of other parallel-cell blocks 100-_m_ in group A.

That is, average resistance Rave(1) is calculated as follows: "average value Rave(1)=(R(2)+R(15)+R(16))/3." Similarly, average value calculation unit 320 calculates "average value Rave(2)=(R(1)+R(15)+R(16))/3," "average value Rave(15) =(R(1)+R(2)+R(16))/3," and "average value Rave(16)=(R (1)+R(2)+R(15))/3." Average value calculation unit similarly calculates average value Rave(m) for each of groups B to D, and the control proceeds to S30.

In S30, parameter ratio calculation unit 330 calculates resistance ratio Rr(m) of parallel-cell block 100-$m$ using internal resistance value R(m) obtained in parameter acquisition unit 310 and average value Rave(m) calculated in average value calculation unit 320. Resistance ratio Rr(m) is a ratio of internal resistance value R(m) to average value Rave(m) and is calculated as "resistance ratio Rr(m)=R(m)/ Rave(m)," and for example, parallel-cell block 100-1 has resistance ratio Rr(1) of R(1)/Rave(1). Once parameter ratio calculation unit 330 has calculated all resistance ratios Rr(1) to Rr(16) of parallel-cell blocks 100-1 to 100-16, the control proceeds to S40. The resistance ratio Rr(m) calculated is stored to memory 302.

In S40, moving-average calculation unit 340 calculates a moving-average value Rrma(m) of resistance ratio Rr(m). In the present embodiment, a previous resistance ratio Rr(m)p, which is resistance ratio Rr(m) calculated when the routine was performed last time, is read from memory 302 and moving-average value Rrma(m) is calculated by the following equation (1).

$$Rrma(m)=Rrma(m)p+(Rr(m)p/n)-(Rr(m)o/n) \qquad (1),$$

where Rrma(m)p represents the immediately previous value of moving-average value Rrma(m), n represents the number (e.g., 10) of data of resistance ratio Rr(m) previously calculated and used in calculating moving-average value Rrma (m), and Rr(m)o represents a value of resistance ratio Rr(m) calculated n+1 times earlier (if n is 10, the value is a value of resistance ratio Rr(m) calculated 11 times earlier). Once moving-average value Rrma(m) of each parallel-cell block 100-$m$ has been calculated, Rrma(m) is stored to memory 302, and the control proceeds to S50.

In S50, index value calculation unit 350 calculates an index value Ri(m). Index value Ri(m) is a difference between resistance ratio Rr(m) of parallel-cell block 100-$m$ and moving-average value Rrma(m), and is calculated as "index value Ri(m)=Rr(m)−Rrma(m)." For example, parallel-cell block 100-1 has an index value Ri(1) of Rr(1)−Rrma (1).

Once index value calculation unit 350 has calculated index value Ri(m) and the control proceeds to S60, state determination unit 360 determines whether index value Ri(m) exceeds a threshold value $\alpha$. When index value Ri(m) exceeds threshold a, a positive determination is made and the control proceeds to S70 to determine that parallel-cell block 100-$m$ to be determined is abnormally degraded. When any of the cells included in parallel-cell block 100-$m$ to be determined is abnormally degraded and the cell's internal resistance value is increased, resistance ratio Rr(m) also increases. However, the increased resistance ratio Rr(m) has an extremely small effect on moving-average value Rrma(m). Therefore, when resistance ratio Rr(m) of parallel-cell block 100-$m$ to be determined minus moving-average value Rrma(m), or index value Ri(m), exceeds threshold value $\alpha$, it can be determined that parallel-cell block 100-$m$ to be determined is abnormally degraded. Further, in S70, identification information of parallel-cell block 100-$m$ determined as being abnormally degraded, e.g., an ID number of parallel-cell block 100-$m$, is written to memory 302 and warning information indicating that abnormal degradation is caused is also output, and thereafter, the current routine ends.

When index value Ri(m) is equal to or less than threshold value $\alpha$ and a negative determination is made in S60, the control proceeds to S80. In S80, state determination unit 360 determines whether internal resistance value R(m) of parallel-cell block 100-$m$ to be determined exceeds a threshold value $\beta$. When internal resistance value R(m) is equal to or less than threshold value $\beta$ and a negative determination is made, the current routine ends. When internal resistance value R(m) exceeds threshold value $\beta$, a positive determination is made and the control proceeds to S90 to determine that parallel-cell block 100-$m$ to be determined is normally degraded. Further, in S90, identification information of parallel-cell block 100-$m$ determined as being normally degraded, e.g., an ID number of parallel-cell block 100-$m$, is written to memory 302 and warning information indicating that normal degradation is caused is also output, and thereafter the current routine ends.

In the present embodiment, whether parallel-cell block 100-$m$ is abnormally degraded is determined based on whether index value Ri(m) exceeds threshold value $\alpha$. Index value Ri(m) is calculated as "index value Ri(m)=Rr(m)− Rrma(m)," and it is a difference between resistance ratio Rr(m) and moving-average value Rrma(m). Resistance ratio Rr(m) is a ratio of internal resistance value R(m) of parallel-cell block 100-$m$ to be determined to average value Rave(m) of the internal resistance values of a plurality of parallel-cell blocks excluding parallel-cell block 100-$m$ to be determined. Therefore, when any of the cells included in parallel-cell block 100-$m$ to be determined is abnormally degraded and the cell's internal resistance value is increased, resistance ratio Rr(m) also increases. Moving-average value Rrma(m) is an average value of time series data of resistance ratio Rr(m), and is an average value of values of resistance ratio Rr(m) previously calculated for n times. Therefore, even when any of the cells included in parallel-cell block 100-$m$ to be determined is abnormally degraded and the cell's internal resistance value is increased, moving-average value Rrma(m) does not have a large value at an initial stage of abnormal degradation. Therefore, when index value Ri(m) exceeds threshold value $\alpha$, it can be determined that parallel-cell block 100-$m$ to be determined is abnormally degraded. Threshold value $\alpha$ may be any value as long as it can be determined thereby that parallel-cell block 100-$m$ to be determined is abnormally degraded, and the value may be determined in advance through an experiment or the like and may for example be 0.2.

In the present embodiment, resistance ratio Rr(m) is a ratio of internal resistance value R(m) of parallel-cell block 100-$m$ to be determined to average value Rave(m) of the internal resistance values of other parallel-cell blocks 100-$m$ close in temperature to parallel-cell block 100-$m$ to be determined. Parallel-cell block 100-$m$ to be determined and the other parallel-cell blocks 100-$m$ close in temperature to parallel-cell block 100-$m$ to be determined can be considered to vary in temperature substantially in the same manner. Therefore, even when parallel-cell block 100-$m$ to be determined has internal resistance value R(m) affected by temperature and thus changed, the other parallel-cell blocks 100-$m$ close in temperature to parallel-cell block 100-$m$ to be determined also have an internal resistance value similarly changed, and average value Rave(m) is also similarly changed. Therefore, resistance ratio Rr(m) is little affected by temperature, and it is unnecessary to calculate internal resistance value R(m) of parallel-cell block 100-*m* through correction in temperature.

In the present embodiment, resistance ratio Rr(m) of parallel-cell block 100-*m* to be determined is obtained using average value Rave(m) of the internal resistance values of "a plurality of parallel-cell blocks excluding parallel-cell block 100-*m* to be determined." Average value Rave(m) does not include internal resistance value R(m) of parallel-cell block 100-*m* to be determined. Therefore, average value Rave(m) will never be increased when parallel-cell block 100-*m* to be determined is abnormally degraded. Therefore, when parallel-cell block 100-*m* to be determined is abnormally degraded, resistance ratio Rr(m) becomes a large value early, and the abnormal degradation of parallel-cell block 100-*m* can be determined early.

In the present embodiment, when parallel-cell block 100-*m* to be determined normally degrades, index value Ri(m) does not exceed threshold value α. (Resistance ratio Rr(m) and moving-average value Rrma(m) never have a large difference therebetween, and index value Ri(m) indicates a value around "0".) In the present embodiment, when it is not determined that parallel-cell block 100-*m* to be determined is abnormally degraded (i.e., when a negative determination is made in S60), internal resistance value R(m) is compared with threshold value β to determine presence/absence of normal degradation (S80). Thus, whether parallel-cell block 100-*m* to be determined is normally degraded can also be determined. Threshold value β may be any value as long as it can be determined thereby that parallel-cell block 100-*m* to be determined is normally degraded, and the value may be determined based on an internal resistance value for which it is determined that a cell included in parallel-cell block 100-*m* has reached its end of life.

Exemplary Variation of First Embodiment

While in the present embodiment, parallel-cell blocks 100-*m* are divided into groups each of parallel-cell blocks 100-*m* close in temperature to calculate average value Rave (m) to obtain index value Ri(m), all parallel-cell blocks configuring battery may be subject to calculation of average value Rave(m) to obtain index value Ri(m).

In the present embodiment, resistance ratio Rr(m) of parallel-cell block 100-*m* to be determined is obtained using average value Rave(m) of the internal resistance values of "a plurality of parallel-cell blocks excluding parallel-cell block 100-*m* to be determined." However, average value Rave(m) may be obtained from the internal resistance values of a plurality of parallel-cell blocks including parallel-cell block 100-*m* to be determined.

In the present embodiment, moving-average value Rrma (m) of resistance ratio Rr(m) is calculated using previous resistance ratio value Rr(m)p calculated in the immediately previous routine. That is, moving-average value Rrma(m) is a moving-average value of resistance ratio Rr(m) calculated in the immediately previous routine and therebefore. However, moving-average value Rrma(m) may be calculated using resistance ratio Rr(m) calculated in the current routine.

In the present embodiment, index value Ri(m) is calculated as "index value Ri(m)=Rr(m)−Rrma(m)." However, index value Ri(m) may be calculated as "index value Ri(m) =Rrma(m)−Rr(m)." In this case, when index value Ri(m) falls below threshold value α, it is determined that abnormal degradation is caused.

In the present embodiment, the process (or flowchart) shown in FIG. 5 is performed whenever battery 100 is externally charged. However, the process shown in FIG. 5 may be performed whenever battery 100's state of charge (SOC) reaches a predetermined value while electric powered vehicle 1 is traveling. Further, the process shown in FIG. 5 may be performed whenever electric powered vehicle 1 starts or ends traveling.

When warning information is output in S70 and S90, an alarm device (not shown) may issue an alarm. The alarm device may turn on a malfunction indication lamp (MIL), a buzzer may be set off, or a human machine interface (HMI) such as a multi-function display may be used to urge a user to replace parallel-cell block 100-*m*.

Second Embodiment

In the first embodiment, internal resistance R(m) of parallel-cell block 100-*m* is used as a parameter to determine a degraded state of parallel-cell block 100-*m*. In a second embodiment, parallel-cell block 100-*m*'s 1-second resistance value and 10-second resistance value are used to determine a state in connection resistance of parallel-cell block 100-*m*.

Figure 7:
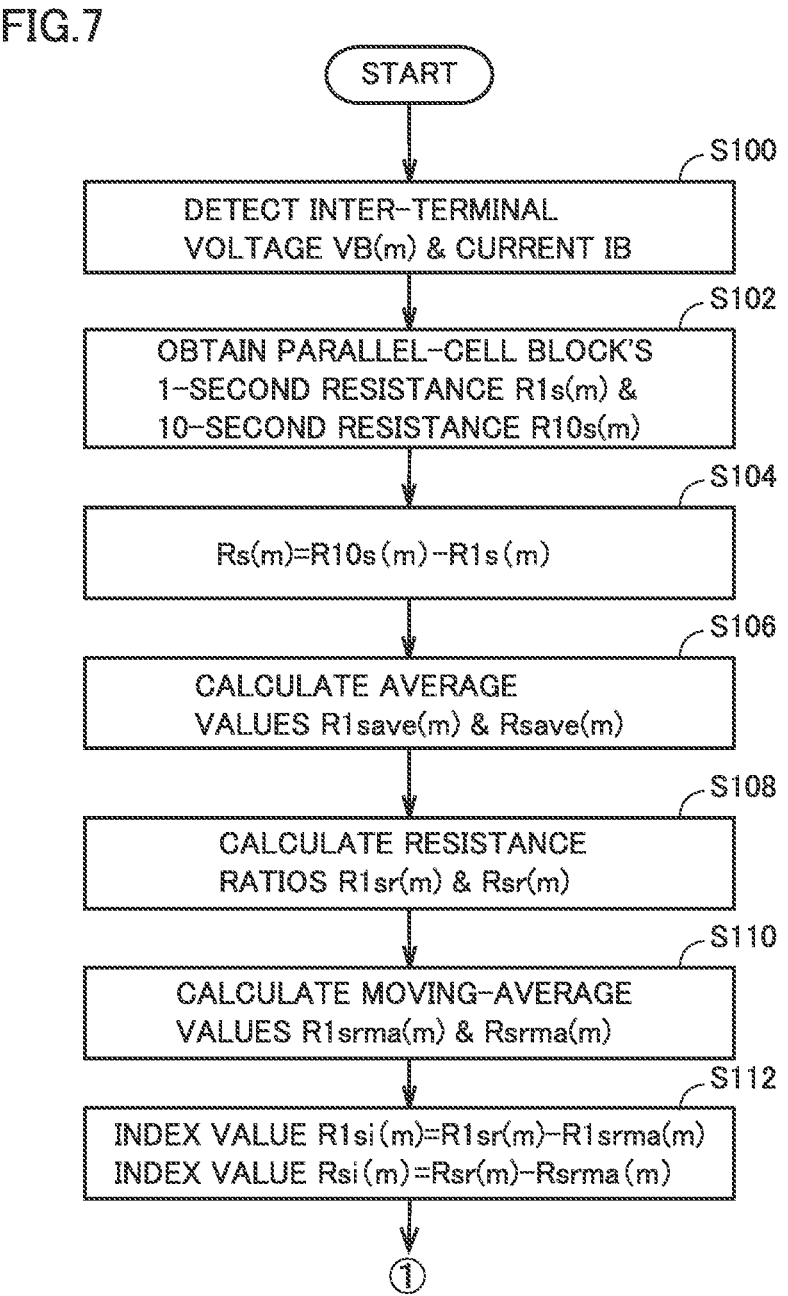
FIG. 7 is a flowchart of a procedure of a process performed by ECU 300 in a second embodiment.
Figure 8:
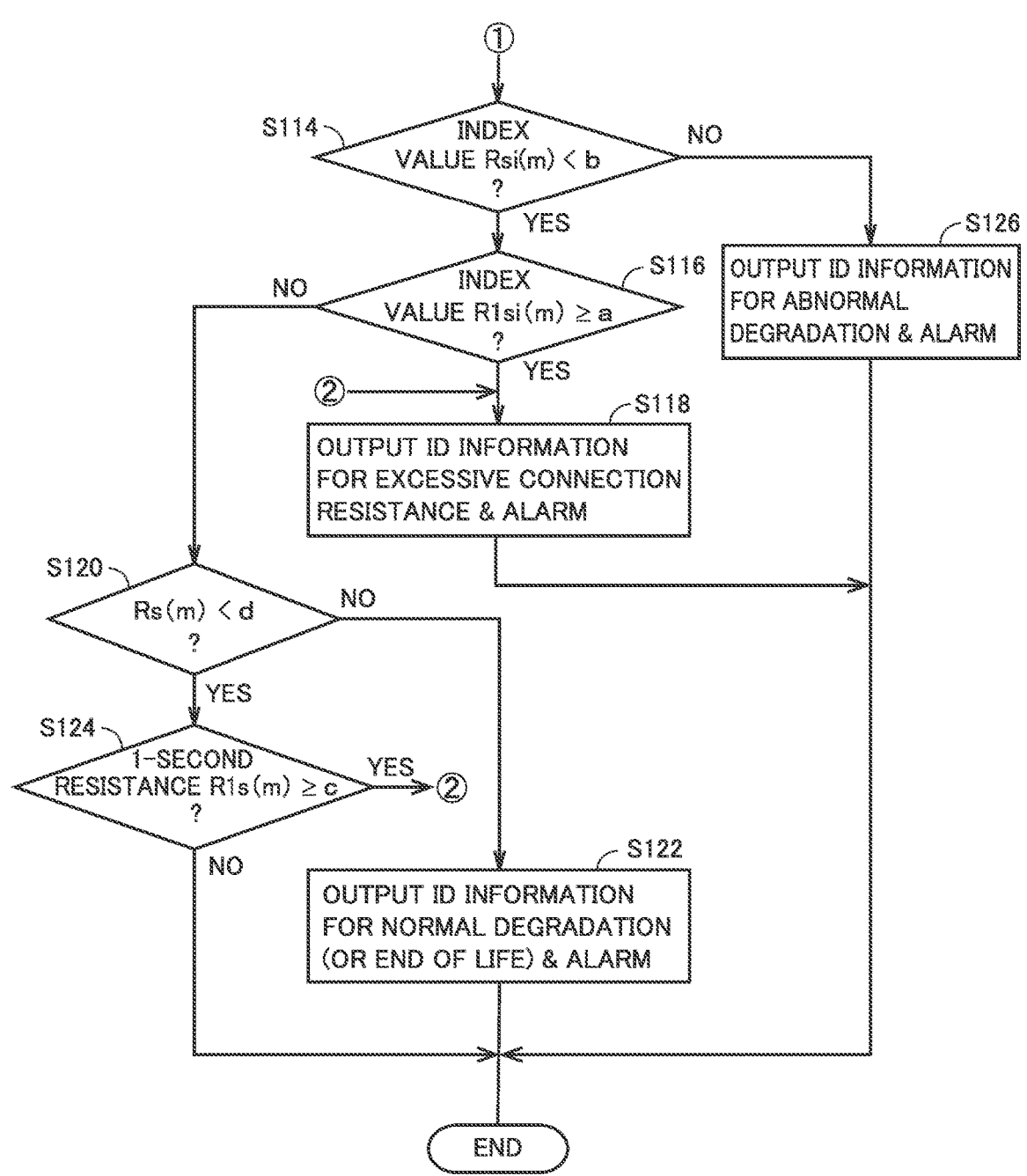
FIG. 8 is a flowchart of a procedure of a process performed by ECU 300 in the second embodiment.

FIGS. 7 and 8 are flowcharts showing a procedure of a process performed by ECU 300 in the second embodiment. Note that any functional block in ECU 300 according to the state determination device is identical to that in the first embodiment, and accordingly, will be described with reference to FIG. 4.

The flowcharts shown in FIGS. 7 and 8 are performed, for example, whenever battery 100 is externally charged. Initially, in S100, parallel-cell block 100-*m*'s inter-terminal voltage VB(m) and current IB are detected. Subsequently, in S102, parameter acquisition unit 310 calculates internal resistance value (or combined resistance value) R(m) of parallel-cell block 100-*m* based on the voltage VB(m) and current IB detected. Internal resistance value R(m) may for example be obtained by obtaining open circuit voltage (OCV) of parallel-cell block 100-*m* and obtaining internal resistance value R(m) from open circuit voltage (OCV), and voltage VB(m) and current IB. Parameter acquisition unit 310 obtains as a 1-second resistance R1s(m) internal resistance value R(m) of parallel-cell block 100-*m* obtained one second after externally charging battery is started. Further, parameter acquisition unit 310 obtains as a 10-second resistance R10s(m) internal resistance value R(m) of parallel-cell block 100-*m* obtained 10 seconds after externally charging battery 100 is started, and the control proceeds to S104.

In S104, parameter acquisition unit 310 subtracts 1-second resistance R1s(m) from 10-second resistance R10s(m) to obtain a differential resistance Rs(m) of parallel-cell block 100-*m* (differential resistance Rs(m)=R10s(m)−R1s(m)). Subsequently, the control proceeds to S106.

In S106, average value calculation unit 320 calculates an average value R1save(m) of 1-second resistances R1s(m) of a plurality of parallel-cell blocks 100-*m* and an average value Rsave(m) of differential resistances Rs(m) of the plurality of parallel-cell blocks 100-*m*. Average value R1save(m) is an average value of 1-second resistances R1s(m) of a plurality of parallel-cell blocks 100-*m* close in temperature to parallel-cell block 100-*m* to be determined. Average value Rsave(m) is an average value of differential resistances Rs(m) of the plurality of parallel-cell blocks 100-*m* close in temperature to parallel-cell block 100-*m* to be determined. In the present embodiment as well, parallel-cell blocks 100-*m* are divided into a plurality of groups each of parallel-cell blocks 100-$m$ close in temperature, as done in the first embodiment, and average value R1save(m) and average value Rsave(m) are calculated. How average value R1save(m) and average value Rsave(m) are calculated will not be described as it is similar to how average value Rave(m) is calculated in the first embodiment.

In S108, parameter ratio calculation unit 330 calculates a 1-second resistance ratio R1sr(m) of parallel-cell block 100-$m$ using 1-second resistance R1s(m) obtained in parameter acquisition unit 310 and average value R1save(m) calculated in average value calculation unit 320. Further, a differential resistance ratio Rsr(m) of parallel-cell block 100-$m$ is calculated using differential resistance Rs(m) obtained in parameter acquisition unit 310 and average value Rsave(m) calculated in average value calculation unit 320. 1-second resistance ratio R1sr(m) is a ratio of 1-second resistance R1s(m) to average value R1save(m), and calculated as "1-second resistance ratio R1sr(m)=R1s(m)/R1save (m)." Differential resistance ratio Rsr(m) is a ratio of differential resistance Rs(m) to average value Rsave(m), and calculated as "differential resistance ratio Rsr(m)=Rs(m)/Rsave(m)." The thus calculated 1-second resistance ratio R1sr(m) and differential resistance ratio Rsr(m) are stored to memory 302, and the control proceeds to a next step, i.e., S110.

In S110, moving-average calculation unit 340 calculates a moving-average value R1srma(m) of 1-second resistance ratio R1sr(m) and a moving-average value Rsrma(m) of differential resistance ratio Rsr(m). How moving-average value R1srma(m) and moving-average value Rsrma(m) are calculated will not be described as it is similar to how moving-average value Rrma(m) is calculated in the first embodiment. Once each parallel-cell block 100-$m$'s moving-average value R1srma(m) and moving-average value Rsrma(m) have been calculated, moving-average value R1srma(m) and moving-average value Rsrma(m) are stored to memory 302, and the control proceeds to S112.

In S112, index value calculation unit 350 calculates an index value R1si(m). Index value R1si(m) is a difference between parallel-cell block 100-$m$'s 1-second resistance ratio R1sr(m) and moving-average value R1srma(m), and is calculated as "index value R1si(m)=R1sr(m)−R1srma(m)." Further, index value calculation unit calculates an index value Rsi(m). Index value Rsi(m) is a difference between parallel-cell block 100-$m$'s differential resistance ratio Rsr (m) and moving-average value Rsrma(m), and is calculated as "index value Rsi(m)=Rsr(m)−Rsrma(m)."

Following S112, in S114, state determination unit 360 determines whether index value Rsi(m) is less than a threshold value b. When index value Rsi(m) is less than threshold value b, a positive determination is made, and the control proceeds to S116 to determine whether index value R1si(m) is greater than or equal to a threshold value $\alpha$. When index value R1si(m) is equal to or greater than threshold value a and a positive determination is made, the control proceeds to S118 to determine that parallel-cell block 100-$m$ has excessive connection resistance. Parallel-cell block 100-$m$'s connection resistance is independent of conduction time, and parallel-cell block 100-$m$'s internal resistance is dependent on conduction time. Accordingly, 10-second resistance R10s (m) minus 1-second resistance R1s(m), or differential resistance Rs(m), will be a value with a conduction time component of the internal resistance of parallel-cell block 100-$m$ alone removed. Thus, when index value Rsi(m) based on differential resistance Rs(m) is less than threshold value b and index value R1si(m) based on 1-second resistance R1s(m) is greater than or equal to threshold value a, it can be determined that parallel-cell block 100-$m$ has excessive connection resistance. Further, in S118, identification information of parallel-cell block 100-$m$ determined as having excessive connection resistance, e.g., an ID number of parallel-cell block 100-$m$, is written to memory 302 and warning information indicating excessive connection resistance is also output, and thereafter, the current routine ends. The connection resistance of parallel-cell block 100-$m$ is metal resistance of a metal component (a conductive member), and contact resistance by a bonded portion.

In S116, when index value R1si(m) is less than threshold value a and a negative determination is made, the control proceeds to S120. Whether differential resistance Rs(m) is less than a threshold value d is determined. When differential resistance Rs(m) is equal to or greater than threshold value d and a positive determination is made, the control proceeds to S122 to determine that parallel-cell block 100-$m$ to be determined is normally degraded. Further, in S122, identification information of parallel-cell block 100-$m$ determined as being normally degraded, e.g., an ID number of parallel-cell block 100-$m$, is written to memory 302 and warning information indicating normal degradation is also output, and thereafter the current routine ends.

When differential resistance Rs(m) is less than threshold value d in S120 and a positive determination is made, the control proceeds to S124 to determine whether 1-second resistance R1s(m) is equal to or greater than a threshold value c. When 1-second resistance R1s(m) is equal to or greater than threshold value c and a positive determination is made, the control proceeds to S118 to determine that parallel-cell block 100-$m$ has excessive connection resistance. When 1-second resistance R1s(m) is less than threshold value c in S124 and a negative determination is made, the current routine ends.

When index value Rsi(m) is equal to or greater than threshold value b in S114, a negative determination is made, and the control proceeds to S126. In S126, it is determined that parallel-cell block 100-$m$ to be determined is abnormally degraded. Further, in S126, identification information of parallel-cell block 100-$m$ determined as being abnormally degraded, e.g., an ID number of parallel-cell block 100-$m$, is written to memory 302 and warning information indicating that abnormal degradation is caused is also output, and thereafter the current routine ends.

Thus, in the second embodiment, parallel-cell block 100-$m$'s 1-second resistance Rs(m) and differential resistance Rs(m) are used to determine parallel-cell block 100-$m$'s connection resistance state and degraded state. Since 1-second resistance Rs(m) and differential resistance Rs(m) are determined based on internal resistance value R(m) of parallel-cell block 100-$m$, they are affected by abnormal degradation of the cells included in parallel-cell block 100-$m$, similarly as in the first embodiment, and thus have the same problem as in the first embodiment. In the second embodiment, even when parallel-cell block 100-$m$ has a cell abnormally degraded, a state of connection resistance is determined based on "index value Rsi(m) that is a difference between differential resistance ratio Rsr(m) and moving-average value Rsrma(m)" and "index value R1si(m) that is a difference between 1-second resistance ratio R1sr(m) and moving-average value R1srma(m)" by using a method similar to that in the first embodiment so that the state of connection resistance can be suitably determined. Thus, as well as in the first embodiment, even when parallel-cell block 100-$m$ has a cell abnormally degraded, a state of connection resistance can be satisfactorily determined.

Note that an exemplary variation similar to that of the first embodiment may also be adopted in the second embodiment.

Third Embodiment

In a third embodiment is determined a degraded state of parallel-cell block 100-$m$ caused as metal or the like included in an electrode, an electrode composite material and the like is dissolved and deposited repeatedly and a conductor penetrates a separator and causes a phenomenon of an internal short circuit (microshorting).

Figure 9:
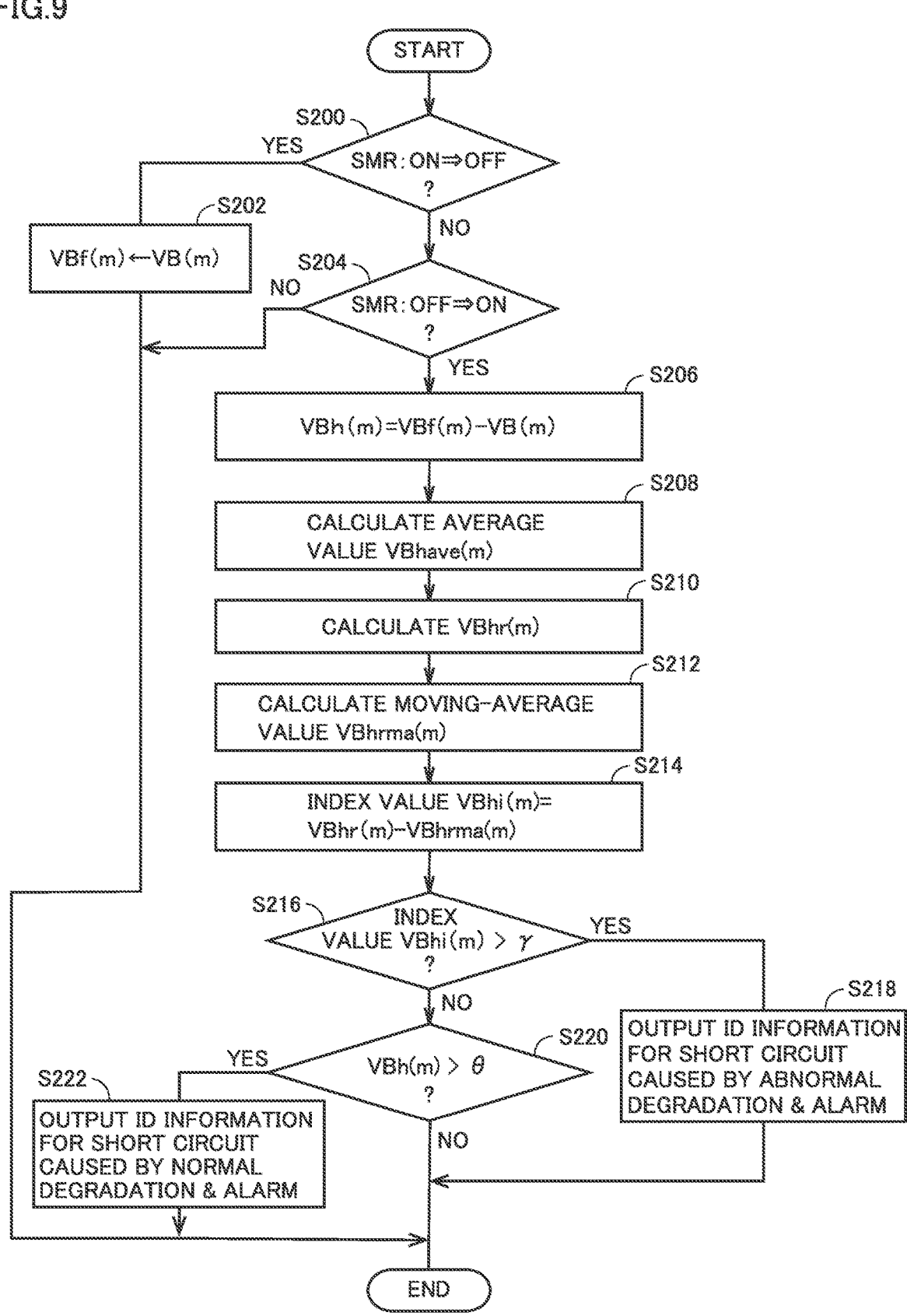
FIG. 9 is a flowchart of a procedure of a process performed by ECU 300 in a third embodiment.

FIG. 9 is a flowchart of a procedure of a process performed by ECU 300 in the third embodiment. Note that any functional block in ECU 300 according to the state determination device is identical to that in the first embodiment, and accordingly, will be described with reference to FIG. 4.

The flowchart shown in FIG. 9 is repeatedly performed at predetermined intervals. Initially, in S200, whether SMR 50 has changed from a closed (ON) state to an open (OFF) state is determined. When SMR 50 changes from ON to OFF, a positive determination is made in S200, and the control proceeds to S202. In S202, inter-terminal voltage VB(m) of parallel-cell block 100-$m$ when SMR 50 changes from ON to OFF is stored to memory 302 as an off-time voltage VBf(m), and the current routine ends.

When SMR 50 is not switched from ON to OFF, a negative determination is made in S200, and the control proceeds to S204 to determine whether SMR 50 is switched from OFF to ON. When SMR 50 is not switched from OFF to ON, a negative determination is made, and the current routine ends. When SMR 50 is switched from OFF to ON, a positive determination is made in S204, and the control proceeds to S206.

In S206, parameter acquisition unit 310 obtains a differential voltage VBh(m) by subtracting from OFF-time voltage VBf(m) read from memory 302 inter-terminal voltage VB(m) of parallel-cell block 100-$m$ obtained when SMR 50 is switched from OFF to ON. "Differential voltage VBh(m) =VBf(m)−VB(m)" is an amount by which inter-terminal voltage VB(m) of parallel-cell block 100-$m$ varies when parallel-cell block 100-$m$ (battery 100) is not used as electric powered vehicle 1 is parked or the like. Accordingly, as differential voltage VBh(m) increases, parallel-cell block 100-$m$ provides a larger amount of self-discharge. Differential voltage VBh(m) represents an amount of self-discharge of parallel-cell block 100-$m$ in magnitude.

Subsequently, in S208, average value calculation unit 320 calculates an average value VBhave(m) of differential voltages VBh(m) of a plurality of parallel-cell blocks 100-$m$. Average value VBhave(m) is an average value of differential voltages VBh(m) of a plurality of parallel-cell blocks 100-$m$ close in temperature to parallel-cell block 100-$m$ to be determined. In the present embodiment as well, parallel-cell blocks 100-$m$ are divided into a plurality of groups each of parallel-cell blocks 100-$m$ close in temperature, as done in the first embodiment, and average value VBhave(m) is calculated. How average value VBhave(m) is calculated will not be described as it is similar to how average value Rave(m) is calculated in the first embodiment.

In S210, parameter ratio calculation unit 330 calculates a differential voltage ratio VBhr(m) of parallel-cell block 100-$m$ using differential voltage VBh(m) obtained in parameter acquisition unit 310 and average value VBhave(m) calculated in average value calculation unit 320. Differential voltage ratio VBhr(m) is a ratio of differential voltage VBh(m) to average value VBhave(m), and is calculated as "differential voltage ratio VBhr(m)=VBh(m)/VBhave(m)." The calculated differential voltage ratio VBhr(m) is stored to memory 302, and the control proceeds to the next step, or S212.

In S212, moving-average calculation unit 340 calculates a moving-average value VBhrma(m) of differential voltage ratio VBhr(m). How moving-average value VBhrma(m) is calculated will not be described as it is similar to how moving-average value Rrma(m) is calculated in the first embodiment. Once moving-average value VBhrma(m) of each parallel-cell block 100-$m$ has been calculated, moving-average value VBhrma(m) is stored to memory 302, and the control proceeds to S214.

In S214, index value calculation unit 350 calculates an index value VBhi(m). Index value VBhi(m) is a difference between differential voltage ratio VBhr(m) of parallel-cell block 100-$m$ and moving-average value VBhrma(m), and is calculated as "index value VBhi(m)=VBhr(m)−VBhrma(m) ."

Once index value calculation unit 350 has calculated index value VBhi(m) and the control proceeds to S216, state determination unit 360 determines whether index value VBhi(m) exceeds a threshold value $\gamma$. When index value VBhi(m) exceeds threshold value $\gamma$, a positive determination is made, and the control proceeds to S218 to determine that parallel-cell block 100-$m$ to be determined is internally short-circuited by abnormal degradation. For example, when any of the cells included in parallel-cell block 100-$m$ to be determined is abnormally degraded and rapidly develops an internal short circuit, differential voltage ratio VBhr(m) also increases. However, moving-average value VBhrma(m) never rapidly increases. Therefore, when a difference between differential voltage ratio VBhr(m) of parallel-cell block 100-$m$ to be determined and moving-average value VBhrma(m), i.e., index value VBhi(m), exceeds threshold value $\gamma$, it can be determined that parallel-cell block 100-$m$ to be determined is internally short-circuited by abnormal degradation. Further, in S218, identification information of parallel-cell block 100-$m$ determined as being abnormally degraded, e.g., an ID number of parallel-cell block 100-$m$, is written to memory 302 and warning information indicating that an internal short circuit is caused by abnormal degradation is also output, and thereafter the current routine ends.

When index value VBhi(m) is equal to or less than threshold value $\gamma$ and a negative determination is made in S216, the control proceeds to S220. In S220, state determination unit 360 determines whether differential voltage VBh(m) of parallel-cell block 100-$m$ to be determined exceeds a threshold value $\theta$. When differential voltage VBh(m) is equal to or less than threshold value $\theta$ and a negative determination is made, the current routine ends. When differential voltage VBh(m) exceeds threshold value $\theta$, a positive determination is made, and the control proceeds to S222 to determine that parallel-cell block 100-$m$ to be determined is internally short-circuited by normal degradation. Further, in S222, identification information of parallel-cell block 100-$m$ determined as being normally degraded, e.g., an ID number of parallel-cell block 100-$m$, is written into memory 302 and warning information indicating that an internal short circuit is caused by normal degradation is also output, and thereafter the current routine ends.

When parallel-cell block 100-$m$ to be determined is internally short-circuited by normal degradation, index value VBhi(m) does not exceed threshold value $\gamma$. (Differential voltage ratio VBhr(m) and moving-average value VBhrma(m) will never have a large difference and instead have substantially the same value, and index value VBhi(m)

indicates a value around "0".) In the present embodiment, when it is not determined that parallel-cell block 100-*m* to be determined is internally short-circuited by abnormal degradation (NO in S216), presence/absence of normal degradation is determined in S220. Thus, whether parallel-cell block 100-*m* to be determined is normally degraded can also be determined. Threshold value θ may be any value as long as it can be determined thereby that parallel-cell block 100-*m* to be determined is normally degraded, and the value may be determined based on a state of an internal short-circuit for which it is determined that a cell included in parallel-cell block 100-*m* has reached its end of life.

In the third embodiment, a state of occurrence of an internal short circuit can satisfactorily be determined when parallel-cell block 100-*m* is abnormally degraded, similarly as described in the first embodiment, and a state of occurrence of an internal short circuit can also be satisfactorily determined when parallel-cell block 100-*m* is normally degraded. Note that an exemplary variation similar to that of the first embodiment may also be adopted in the third embodiment.

Fourth Embodiment

In the first embodiment, internal resistance R(m) of parallel-cell block 100-*m* is used as a parameter to determine a degraded state of parallel-cell block 100-*m*. In a fourth embodiment, parallel-cell block 100-*m*'s cell capacity is used to determine a degraded state of parallel-cell block 100-*m*.

Figure 10:
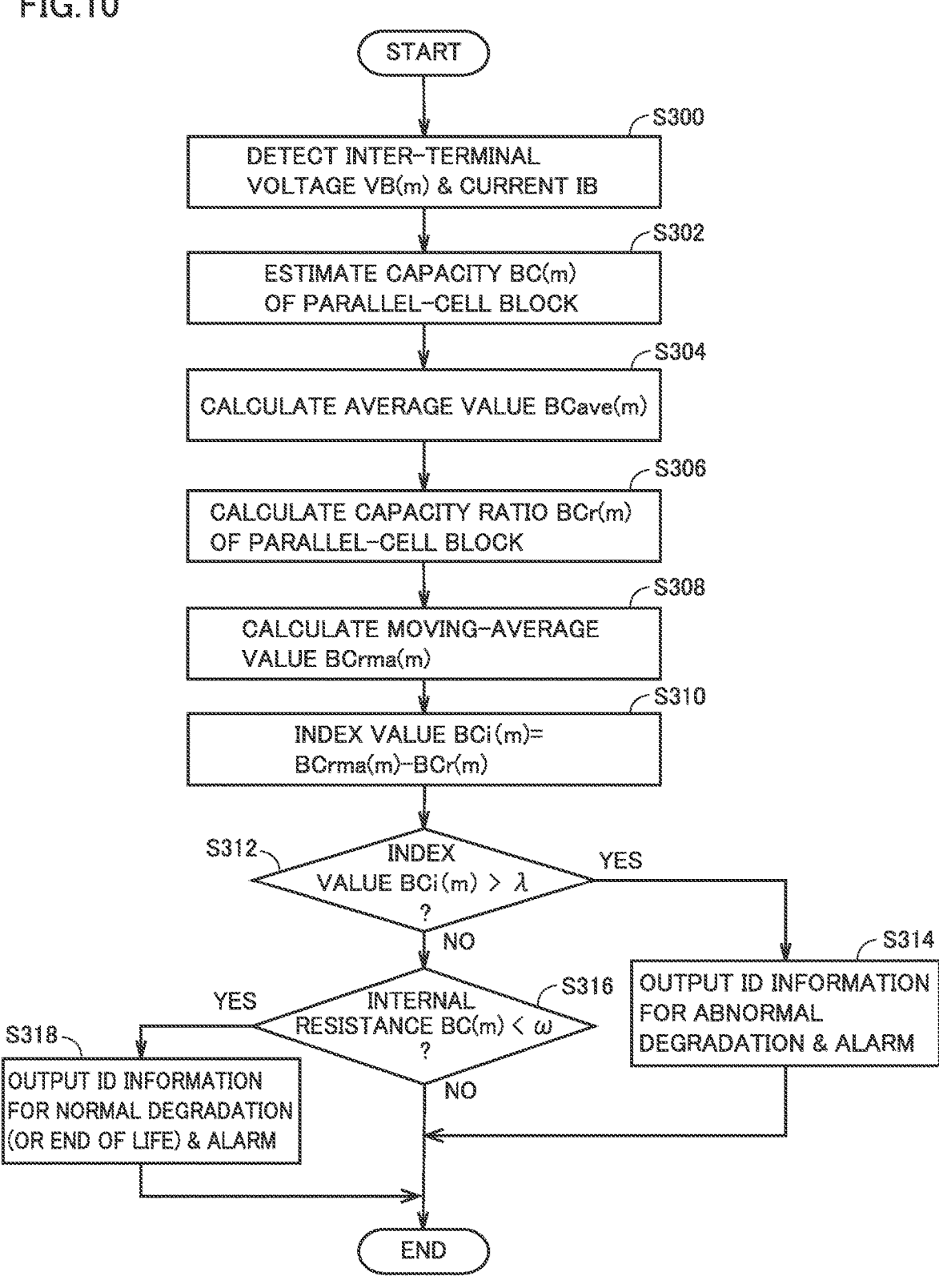
FIG. 10 is a flowchart of a procedure of a process performed by ECU 300 in a fourth embodiment.

FIG. 10 is a flowchart of a procedure of a process performed by ECU 300 in the fourth embodiment. Note that any functional block in ECU 300 according to the state determination device is identical to that in the first embodiment, and accordingly, will be described with reference to FIG. 4.

The flowchart shown in FIG. 10 is performed, for example, whenever battery is externally charged. Initially, in S300, parallel-cell block 100-*m*'s inter-terminal voltage VB(m) and current IB are detected. Subsequently, in S302, parameter acquisition unit 310 calculates and obtains a capacity BC(m) of parallel-cell block 100-*m* based on the detected voltage VB(m) and current IB. Capacity BC(m) may for example be such that a predicted value in voltage of the cells is calculated from parallel-cell block 100-*m*'s open circuit voltage (OCV) and internal resistance (or combined resistance), and current IB, and an equivalent circuit model of the cells is used to estimate the cells' capacity such that the predicted value in voltage of the cells and voltage VB(m) have a small difference (i.e., a prediction error method) to thus determine the cells' capacity. Once parameter acquisition unit 310 has obtained capacity BC(m) of parallel-cell block 100-*m*, the control proceeds to S304.

In S304, average value calculation unit 320 calculates an average value BCave(m) of capacities BC(m) of a plurality of parallel-cell blocks 100-*m*. Average value BCave(m) is an average value of capacities BC(m) of a plurality of parallel-cell blocks 100-*m* close in temperature to parallel-cell block 100-*m* to be determined. In the present embodiment as well, parallel-cell blocks 100-*m* are divided into a plurality of groups each of parallel-cell blocks 100-*m* close in temperature, as done in the first embodiment, and average value BCave(m) is calculated. How average value BCave(m) is calculated will not be described as it is similar to how average value Rave(m) is calculated in the first embodiment.

In S306, parameter ratio calculation unit 330 calculates a capacity ratio BCr(m) of parallel-cell block 100-*m* using capacity BC(m) obtained in parameter acquisition unit 310 and average value BCave(m) calculated in average value calculation unit 320. Capacity ratio BCr(m) is a ratio of capacity BC(m) to average value BCave(m), and is calculated as "capacity ratio BCr(m)=BC(m)/BCave(m)." The calculated capacity ratio BCr(m) is stored to memory 302, and the control proceeds to the next step, i.e., S308.

In S308, moving-average calculation unit 340 calculates a moving-average value BCrma(m) of capacity ratio BCr(m). How moving-average value BCrma(m) is calculated will not be described as it is similar to how moving-average value Rrma(m) is calculated in the first embodiment. Once moving-average value BCrma(m) of each parallel-cell block 100-*m* has been calculated, moving-average value BCrma(m) is stored to memory 302, and the control proceeds to S310.

In S310, index value calculation unit 350 calculates an index value BCi(m). Index value BCi(m) is a difference between moving-average value BCrma(m) and capacity ratio BCr(m), and is calculated as "index value BCi(m) =BCrma(m)−BCr(m)."

Once index value calculation unit 350 has calculated index value BCi(m) and the control proceeds to S312, state determination unit 360 determines whether index value BCi(m) exceeds a threshold value λ. When index value BCi(m) exceeds threshold λ, a positive determination is made, and the control proceeds to S314 to determine that parallel-cell block 100-*m* to be determined is abnormally degraded. Capacity BC(m) of parallel-cell block 100-*m* to be determined is estimated based on internal resistance (or combined resistance). Parallel-cell block 100-*m*'s internal resistance (or combined resistance) is a harmonic average of the internal resistance of each cell. Therefore, even when any of the cells included in parallel-cell block 100-*m* to be determined is abnormally degraded and that cell's capacity is rapidly decreased, parallel-cell block 100-*m*'s internal resistance (or combined resistance) will never rapidly decrease, and capacity BC(m) of parallel-cell block 100-*m* to be determined does not significantly decrease, and accordingly, capacity ratio BCr(m) does not significantly decrease, either. However, the decrease of capacity ratio BCr(m) has an extremely small effect on moving-average value BCrma (m). Therefore, when a difference between capacity ratio BCr(m) of parallel-cell block 100-*m* to be determined and moving-average value BCrma(m), i.e., index value BCi(m), exceeds threshold value λ, it can be determined that parallel-cell block 100-*m* to be determined is reduced in capacity by abnormal degradation. Further, in S314, identification information of parallel-cell block 100-*m* determined as being abnormally degraded, e.g., an ID number of parallel-cell block 100-*m*, is written to memory 302 and warning information indicating that abnormal degradation is caused is also output, and thereafter, the current routine ends.

When index value BCi(m) is equal to or less than threshold value λ and a negative determination is made in S312, the control proceeds to S316. In S316, state determination unit 360 determines whether parallel-cell block 100-*m* to be determined has capacity BC(m) less than a threshold value w. When capacity BC(m) is equal to or greater than threshold value w and a negative determination is made, the current routine ends. When capacity BC(m) is less than threshold value w, a positive determination is made, and the control proceeds to S318 to determine that parallel-cell block 100-*m* to be determined is reduced in capacity by normal degradation. Further, in S318, identification information of parallel-cell block 100-*m* determined as being normally degraded, e.g., an ID number of parallel-cell block 100-$m$, is written to memory 302 and warning information indicating that normal degradation is caused is also output, and thereafter the current routine ends.

In the fourth embodiment, a degraded state can satisfactorily be determined when parallel-cell block 100-$m$ is abnormally degraded, similarly as described in the first embodiment, and a degraded state can also be satisfactorily determined when parallel-cell block 100-$m$ is normally degraded. Note that an exemplary variation similar to that of the first embodiment may also be adopted in the fourth embodiment.

The embodiments in the present disclosure may be exemplified in such a manner as below:

1) A device that determines a state of a battery pack (100) comprising three or more series-connected parallel-cell blocks (100-$m$) each including a plurality of cells connected in parallel, comprising: a parameter acquisition unit (310) that obtains an internal resistance value (R(m)) of a parallel-cell block (100-$m$); a parameter ratio calculation unit (330) that calculates a resistance ratio (Rr(m)) that is a ratio of an internal resistance value (R(m)) of a parallel-cell block (100-$m$) to be determined to an average value (Rave) of internal resistance values (R(m)) of a plurality of parallel-cell blocks (100-$m$); a moving-average calculation unit (340) that calculates a moving-average value (Rrma (m)) of the resistance ratio (Rr(m)); an index value calculation unit (350) that obtains an index value (Ri(m)) that is a difference between the resistance ratio (Rr(m)) of the parallel-cell block (100-$m$) to be determined and the moving-average value (Rrma(m)); and a state determination unit (360) that determines a state of the parallel-cell block (100-$m$) to be determined, based on the index value (Ri(m)).

2) In item 1), when it is determined that the index value (Ri(m)) deviates from a predetermined range, e.g., when the index value (Ri(m)) exceeds a threshold value (a), the state determination unit (360) determines that the parallel-cell block (100-$m$) to be determined is abnormally degraded.

3) In item 1) or 2) the state determination unit (360) is further configured to determine that the parallel-cell block (100-$m$) to be determined is normally degraded when the internal resistance value (R(m)) of the parallel-cell block (100-$m$) to be determined exceeds a threshold value (β).

4) A device that determines a state of a battery pack (100) comprising three or more series-connected parallel-cell blocks (100-$m$) each including a plurality of cells connected in parallel, comprising: a parameter acquisition unit (310) that obtains a differential resistance (Rs(m)) based on a 1-second resistance (R1s(m)) of a parallel-cell block (100-$m$) and a 10-second resistance (R10s(m)) of the parallel-cell block (100-$m$); a parameter ratio calculation unit (330) that calculates a 1-second resistance ratio (R1sr(m)) that is a ratio of a 1-second resistance (R1s(m)) of a parallel-cell block (100-$m$) to be determined to an average value (R1save) of 1-second resistances (R1s(m)) of a plurality of parallel-cell blocks (100-$m$), and also calculates a differential resistance ratio (Rsr(m)) that is a ratio of a differential resistance (Rs(m)) of the parallel-cell block (100-$m$) to be determined to an average value (Rsave) of differential resistances (Rs(m)) of the plurality of parallel-cell blocks (100-$m$); a moving-average calculation unit (340) that calculates a moving-average value (R1srma(m)) of the 1-second resistance ratio (R1sr(m))

and also calculates a moving-average value (Rsrma (m)) of the differential resistance ratio (Rsr(m)); an index value calculation unit (350) that calculates an index value (R1si(m)) that is a difference between the 1-second resistance ratio (R1sr(m)) of the parallel-cell block (100-$m$) to be determined and the moving-average value (R1srma(m)), and also calculates an index value (Rsi(m)) that is a difference between the differential resistance ratio (Rsr(m)) of the parallel-cell block (100-$m$) to be determined and the moving-average value (Rsrma(m)); and a state determination unit (360) that determines an excessive state of connection resistance of the parallel-cell block (100-$m$) to be determined, based on the index value (R1si(m)) and the index value (Rsi(m)).

5) In item 4), when it is determined that the index value (Rsi(m)) is less than a threshold value (b) and the index value (R1si(m)) is equal to or greater than a threshold value (a), the state determination unit (360) determines that the parallel-cell block (100-$m$) to be determined has excessive connection resistance.

6) In item 4) or 5), the state determination unit (360) is further configured to determine that the parallel-cell block (100-$m$) to be determined is abnormally degraded when the index value (Rsi(m)) of the parallel-cell block (100-$m$) to be determined is equal to or greater than the threshold value (b).

7) In item 4), 5) or 6), the state determination unit (360) is configured to determine that the parallel-cell block (100-$m$) to be determined is normally degraded when the differential resistance (Rs(m)) of the parallel-cell block (100-$m$) to be determined is equal to or greater than a threshold value (d).

8) In item 4), 5), 6) or 7), the state determination unit (360) is configured to determine that the parallel-cell block (100-$m$) to be determined has excessive connection resistance when the 1-second resistance (R1s(m)) of the parallel-cell block (100-$m$) to be determined is equal to or greater than a threshold value (c).

9) A device that determines a state of a battery pack (100) comprising three or more series-connected parallel-cell blocks (100-$m$) each including a plurality of cells connected in parallel, comprising: a parameter acquisition unit (310) that obtains a differential voltage (VBh(m)) that is a difference between a voltage (VBf (m)) of a parallel-cell block (100-$m$) when an SMR (50) that connects (ON)/disconnects (OFF) the battery pack (100) and a PCU (40) is interrupted and a voltage (VBh(m)) of the parallel-cell block (100-$m$) when the SMR (50) is connected; a parameter ratio calculation unit (330) that calculates a differential voltage ratio (VBhr(m)) that is a ratio of a differential voltage (VBh(m)) of a parallel-cell block (100-$m$) to be determined to an average value (VBhave) of differential voltages (VBh(m)) of a plurality of parallel-cell blocks (100-$m$); a moving-average calculation unit (340) that calculates a moving-average value (VBhrma(m)) of the differential voltage ratio (VBhr(m)); an index value calculation unit (350) that obtains an index value (VBhi(m)) that is a difference between the differential voltage ratio (VBhr(m)) of the parallel-cell block (100-$m$) to be determined and the moving-average value (VBhrma(m)); and a state determination unit (360) that determines an internal short circuit state of the parallel-cell block (100-$m$) to be determined, based on the index value (VBhi(m)).

10) In item (9), when it is determined that the index value (VBhi(m)) deviates from a predetermined range, e.g., when the index value (VBhi(m)) exceeds a threshold value (γ), the state determination unit (360) determines that the parallel-cell block (100-*m*) to be determined is internally short-circuited by abnormal degradation.

11) In item 9) or 10), the state determination unit (360) is further configured to determine that the parallel-cell block (100-*m*) to be determined is internally short-circuited by normal degradation when the differential voltage (VBh(m)) of the parallel-cell block (100-*m*) to be determined exceeds a threshold value (θ).

12) A device that determines a state of a battery pack (100) comprising three or more series-connected parallel-cell blocks (100-*m*) each including a plurality of cells connected in parallel, comprising: a parameter acquisition unit (310) that obtains a capacity (BC(m)) of a parallel-cell block (100-*m*); a parameter ratio calculation unit (330) that calculates a capacity ratio (BCr(m)) that is a ratio of a capacity (BC(m)) of a parallel-cell block (100-*m*) to be determined to an average value (BCave) of capacities (BCr(m)) of a plurality of parallel-cell blocks (100-*m*); a moving-average calculation unit (340) that calculates a moving-average value (BCrma(m)) of the capacity ratio (BCr(m)); an index value calculation unit (350) that obtains an index value (BCi(m))) that is a difference between the capacity ratio (BCr(m)) of the parallel-cell block (100-*m*) to be determined and the moving-average value (BCrma(m)); and a state determination unit (360) that determines a state of the parallel-cell block (100-*m*) to be determined, based on the index value (BCi(m)).

13) In item (12), when it is determined that the index value (BCi(m)) deviates from a predetermined range, e.g., when the index value (BCi(m)) exceeds a threshold value (k), the state determination unit (360) determines that the parallel-cell block (100-*m*) to be determined is abnormally degraded.

14) In item 12) or 13), the state determination unit (360) is further configured to determine that the parallel-cell block (100-*m*) to be determined is normally degraded when the capacity (BC(m)) of the parallel-cell block (100-*m*) to be determined is less than a threshold value (w).

Although the embodiments of the present invention have been described, it should be considered that the embodiments disclosed herein are illustrative and non-restrictive in every respect. The scope of the present invention is defined by the terms of the claims, and is intended to include any modifications within the scope and meaning equivalent to the terms of the claims.

What is claimed is:

1. A device that determines a state of a battery pack comprising three or more series-connected parallel-cell blocks each including a plurality of cells connected in parallel, comprising:
   a voltage sensor that detects an inter-terminal voltage of the parallel-cell block;
   a current sensor that detects that detects amount of the current flowing through the parallel-cell block;
   a processor configured to execute machine readable instructions to:
   obtain a parameter indicating a state of the parallel-cell block;

calculate a parameter ratio that is a ratio of a parameter of a parallel-cell block to be determined to an average value of parameters of a plurality of parallel-cell blocks;
   calculate a moving-average value of the parameter ratio;
   obtain an index value that is a difference between the parameter ratio of the parallel-cell block to be determined and the moving-average value of the parameter ratio;
   determine a state of the parallel-cell block to be determined, based on the index value; and
   provide warning information indicating that abnormal degradation is caused when it is determined that the index value exceeds a threshold value;
   wherein
   the parameter indicating a state of the parallel-cell block includes the inter-terminal voltage detected by the voltage sensor and the amount of the current flowing detected by the current sensor,
   the processor obtains the parameter of the parallel-cell block to be determined whenever a predetermined time arrives,
   calculates the index value based on a moving-average value of the parameter ratio calculated using a parameter of the parallel-cell block to be determined obtained when the predetermined time immediately previously arrives and a parameter of the parallel-cell block to be determined obtained when the predetermined time currently arrives;
   as the plurality of parallel-cell blocks subject to calculation of the average value, parallel-cell blocks close in temperature to the parallel-cell block to be determined are selected;
   the processor obtains the parameter of the parallel-cell block to be determined whenever a predetermined time arrives;
   the temperature of the parallel-cell block to be determined is that of the parallel-cell block to be determined at the predetermined time;
   the battery pack is a battery pack mounted in a vehicle;
   the predetermined time is any one of: when the battery pack is externally charged; when an amount of power stored in the battery pack reaches a predetermined value while the vehicle is traveling; when the vehicle starts traveling; and when the vehicle ends traveling; and
   an inlet is connected to the battery pack, and the battery pack is charged by electric power supplied from the inlet.

2. The device that determines a state of a battery pack according to claim 1, wherein the processor calculates a second parameter ratio that is the ratio of the parameter of the parallel-cell block to be determined to an average value of parameters of a plurality of parallel-cell blocks excluding the parallel-cell block to be determined.

3. The device that determines a state of a battery pack according to claim 1, wherein the parameter of the parallel-cell block to be determined is at least one of an internal resistance of the parallel-cell block of the parallel-cell block to be determined, an amount of self-discharge by the parallel-cell block of the parallel-cell block to be determined, and a cell capacity of the parallel-cell block of the parallel-cell block to be determined.

4. The device that determines a state of a battery pack according to claim 1, wherein the processor determines a degraded state of the parallel-cell block to be determined, based on the index value, and determines the degraded state of the parallel-cell block to be determined, based on the parameter of the parallel-cell block to be determined.

5. The device that determines a state of a battery pack according to claim 1, wherein the processor outputs at least one of warning information and identification information of the parallel-cell block to be determined when it is determined that the index value deviates from a predetermined range.

6. A method for determining a state of a battery pack comprising three or more series-connected parallel-cell blocks each including a plurality of cells connected in parallel, the method comprising:

obtaining a parameter indicating a state of the parallel-cell block;

calculating a parameter ratio that is a ratio of a parameter of a parallel-cell block to be determined to an average value of parameters of a plurality of parallel-cell blocks;

calculating a moving-average value of the parameter ratio;

obtaining an index value that is a difference between the parameter ratio of the parallel-cell block to be determined and the moving-average value;

determining a state of the parallel-cell block to be determined, based on the index value;

calculating the index value based on a moving-average value of the parameter ratio calculated using a parameter of the parallel-cell block to be determined obtained when the predetermined time immediately previously arrives and a parameter of the parallel-cell block to be determined obtained when the predetermined time currently arrives;

as the plurality of parallel-cell blocks subject to calculation of the average value, selecting parallel-cell blocks close in temperature to the parallel-cell block to be determined;

obtaining the parameter of the parallel-cell block to be determined whenever a predetermined time arrives;

the temperature of the parallel-cell block to be determined is that of the parallel-cell block to be determined at the predetermined time;

the battery pack is a battery pack mounted in a vehicle;

the predetermined time is any one of: when the battery pack is externally charged; when an amount of power stored in the battery pack reaches a predetermined value while the vehicle is traveling; when the vehicle starts traveling; and when the vehicle ends traveling; and charging the battery pack by electric power supplied from an inlet connected to the battery pack.

7. The method for determining a state of a battery pack according to claim 6, wherein the calculating a parameter ratio includes calculating a second parameter ratio that is the ratio of the parameter of the parallel-cell block to be determined to an average value of parameters of a plurality of parallel-cell blocks excluding the parallel-cell block to be determined.

* * * * *